(12) United States Patent
McGrath et al.

(10) Patent No.: US 8,912,661 B2
(45) Date of Patent: Dec. 16, 2014

(54) STACKED DIE ASSEMBLY HAVING REDUCED STRESS ELECTRICAL INTERCONNECTS

(75) Inventors: Scott McGrath, Scotts Valley, CA (US); Jeffrey S. Leal, Scotts Valley, CA (US); Ravi Shenoy, Dublin, CA (US); Loreto Cantillep, San Jose, CA (US); Simon McElrea, Scotts Valley, CA (US); Suzette K. Pangrle, Cupertino, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 12/939,524

(22) Filed: Nov. 4, 2010

(65) Prior Publication Data

US 2011/0272825 A1 Nov. 10, 2011

Related U.S. Application Data

(60) Provisional application No. 61/280,584, filed on Nov. 4, 2009.

(51) Int. Cl.
*H01L 23/48* (2006.01)
*H01L 21/56* (2006.01)
*H01L 23/00* (2006.01)
*H01L 23/31* (2006.01)
*H01L 25/065* (2006.01)
*H01L 23/498* (2006.01)

(52) U.S. Cl.
CPC .......... *H01L 21/563* (2013.01); *H01L 2924/014* (2013.01); *H01L 2924/14* (2013.01);

(Continued)

(58) Field of Classification Search
CPC . H01L 24/28; H01L 23/4855; H01L 23/4824; H01L 23/31; H01L 23/3157; H01L 23/3185; H01L 23/5389; H01L 23/63; H01L 23/89; H01L 23/49805
USPC .................................................. 257/777, 690
See application file for complete search history.

(56) References Cited

U.S. PATENT DOCUMENTS

| 4,323,914 A | 4/1982 | Berndlmaier et al. |
| 4,336,551 A | 6/1982 | Fujita et al. |

(Continued)

FOREIGN PATENT DOCUMENTS

| CN | 1531069 A | 9/2004 |
| DE | 102004039906 A1 | 8/2005 |

(Continued)

OTHER PUBLICATIONS

Office Action mailed Feb. 7, 2006, U.S. Appl. No. 11/097,829.

(Continued)

*Primary Examiner* — Wael Fahmy
*Assistant Examiner* — Sarah Salerno
(74) *Attorney, Agent, or Firm* — Lerner, David, Littenberg, Krumholz & Mentlik, LLP

(57) ABSTRACT

Methods are disclosed for improving electrical interconnection in stacked die assemblies, and stacked die assemblies are disclosed having structural features formed by the methods. The resulting stacked die assemblies are characterized by having reduced electrical interconnect failure.

24 Claims, 13 Drawing Sheets

(52) U.S. Cl.
CPC ........... *H01L 2924/01014* (2013.01); *H01L 2924/01013* (2013.01); *H01L 23/562* (2013.01); *H01L 2924/01005* (2013.01); *H01L 2924/01033* (2013.01); *H01L 24/24* (2013.01); *H01L 23/49805* (2013.01); *H01L 2224/16225* (2013.01); *H01L 2924/01006* (2013.01); *H01L 24/82* (2013.01); *H01L 23/3121* (2013.01); *H01L 2224/24051* (2013.01); *H01L 24/32* (2013.01); *H01L 24/16* (2013.01); *H01L 24/06* (2013.01); *H01L 2224/24145* (2013.01); *H01L 2224/24226* (2013.01); *H01L 2924/01047* (2013.01); *H01L 2224/32145* (2013.01); *H01L 2225/06517* (2013.01); *H01L 2225/06551* (2013.01); *H01L 2224/0401* (2013.01); *H01L 2224/73203* (2013.01); *H01L 25/0657* (2013.01); *H01L 2224/24011* (2013.01)
USPC .................................. 257/777; 257/690

(56) References Cited

U.S. PATENT DOCUMENTS

| | | | |
|---|---|---|---|
| 4,363,076 A | 12/1982 | McIver | |
| 4,500,905 A | 2/1985 | Shibata | |
| 4,784,972 A | 11/1988 | Hatada | |
| 5,107,325 A | 4/1992 | Nakayoshi | |
| 5,138,438 A | 8/1992 | Masayuki et al. | |
| 5,200,362 A | 4/1993 | Lin et al. | |
| 5,218,234 A * | 6/1993 | Thompson et al. | 257/738 |
| 5,311,401 A | 5/1994 | Gates, Jr. et al. | |
| 5,331,591 A | 7/1994 | Clifton | |
| 5,334,872 A | 8/1994 | Ueda et al. | |
| 5,434,745 A | 7/1995 | Shokrgozar et al. | |
| 5,466,634 A | 11/1995 | Beilstein, Jr. et al. | |
| 5,538,758 A | 7/1996 | Beach et al. | |
| 5,571,754 A | 11/1996 | Bertin et al. | |
| 5,616,953 A | 4/1997 | King et al. | |
| 5,629,566 A | 5/1997 | Doi et al. | |
| 5,691,248 A | 11/1997 | Cronin et al. | |
| 5,698,895 A | 12/1997 | Pedersen et al. | |
| 5,721,151 A | 2/1998 | Padmanabhan et al. | |
| 5,731,631 A | 3/1998 | Yama et al. | |
| 5,737,191 A | 4/1998 | Horiuchi et al. | |
| 5,870,351 A | 2/1999 | Ladabaum et al. | |
| 5,879,965 A | 3/1999 | Jiang et al. | |
| 5,891,761 A | 4/1999 | Vindasius et al. | |
| 5,910,687 A | 6/1999 | Chen et al. | |
| 5,946,545 A | 8/1999 | Bertin et al. | |
| 5,965,947 A | 10/1999 | Nam et al. | |
| 6,030,854 A | 2/2000 | Mashimoto et al. | |
| 6,034,438 A | 3/2000 | Petersen | |
| 6,087,716 A | 7/2000 | Ikeda | |
| 6,107,164 A | 8/2000 | Ohuchi | |
| 6,175,158 B1 | 1/2001 | Degani et al. | |
| 6,228,686 B1 | 5/2001 | Smith et al. | |
| 6,255,726 B1 | 7/2001 | Vindasius et al. | |
| 6,262,476 B1 | 7/2001 | Vidal | |
| 6,271,598 B1 | 8/2001 | Vindasius et al. | |
| 6,297,657 B1 | 10/2001 | Thiessen et al. | |
| 6,303,977 B1 | 10/2001 | Schroen et al. | |
| 6,315,856 B1 | 11/2001 | Asagiri et al. | |
| 6,326,244 B1 | 12/2001 | Brooks et al. | |
| 6,326,689 B1 | 12/2001 | Thomas | |
| 6,338,980 B1 | 1/2002 | Satoh | |
| 6,351,030 B2 | 2/2002 | Havens et al. | |
| 6,472,746 B2 * | 10/2002 | Taniguchi et al. | 257/723 |
| 6,476,467 B2 * | 11/2002 | Nakamura et al. | 257/668 |
| 6,569,709 B2 | 5/2003 | Derderian | |
| D475,981 S | 6/2003 | Michii | |
| 6,580,165 B1 | 6/2003 | Singh | |
| 6,582,992 B2 | 6/2003 | Poo et al. | |
| 6,593,648 B2 | 7/2003 | Emoto | |
| 6,607,938 B2 | 8/2003 | Kwon et al. | |
| 6,607,941 B2 | 8/2003 | Prabhu et al. | |
| 6,621,155 B1 | 9/2003 | Perino et al. | |
| 6,621,172 B2 | 9/2003 | Nakayama et al. | |
| 6,656,827 B1 | 12/2003 | Tsao et al. | |
| 6,667,543 B1 | 12/2003 | Chow et al. | |
| 6,670,701 B2 | 12/2003 | Matsuura et al. | |
| 6,674,159 B1 | 1/2004 | Peterson et al. | |
| 6,686,655 B2 | 2/2004 | Moden et al. | |
| 6,706,971 B2 | 3/2004 | Albert et al. | |
| 6,722,213 B2 | 4/2004 | Offen et al. | |
| 6,730,997 B2 | 5/2004 | Beyne et al. | |
| 6,737,743 B2 | 5/2004 | Urakawa | |
| 6,747,348 B2 | 6/2004 | Jeung et al. | |
| 6,750,547 B2 | 6/2004 | Jeung et al. | |
| 6,756,252 B2 * | 6/2004 | Nakanishi | 438/118 |
| 6,802,446 B2 | 10/2004 | Chaudhuri et al. | |
| 6,844,623 B1 | 1/2005 | Peterson et al. | |
| 6,849,802 B2 | 2/2005 | Song et al. | |
| 6,908,784 B1 | 6/2005 | Farnworth et al. | |
| 6,910,268 B2 | 6/2005 | Miller | |
| 6,940,022 B1 | 9/2005 | Vinciarelli et al. | |
| 6,956,283 B1 | 10/2005 | Peterson | |
| 6,964,915 B2 | 11/2005 | Farnworth et al. | |
| 6,972,480 B2 | 12/2005 | Zilber et al. | |
| 6,973,718 B2 | 12/2005 | Sheppard, Jr. et al. | |
| 6,984,885 B1 | 1/2006 | Harada et al. | |
| 7,005,324 B2 | 2/2006 | Imai | |
| 7,029,949 B2 | 4/2006 | Farnworth et al. | |
| 7,061,125 B2 | 6/2006 | Cho et al. | |
| 7,115,986 B2 | 10/2006 | Moon et al. | |
| 7,180,168 B2 | 2/2007 | Imai | |
| 7,190,060 B1 | 3/2007 | Chiang | |
| 7,196,262 B2 | 3/2007 | Gronet | |
| 7,208,335 B2 | 4/2007 | Boon et al. | |
| 7,208,345 B2 | 4/2007 | Meyer et al. | |
| 7,215,018 B2 | 5/2007 | Vindasius et al. | |
| 7,221,051 B2 | 5/2007 | Ono et al. | |
| 7,245,021 B2 | 7/2007 | Vindasius et al. | |
| 7,259,455 B2 | 8/2007 | Seto | |
| 7,279,363 B2 | 10/2007 | Cherukuri et al. | |
| 7,285,865 B2 | 10/2007 | Kwon et al. | |
| 7,335,533 B2 | 2/2008 | Derderian | |
| 7,355,274 B2 | 4/2008 | Lim | |
| 7,405,138 B2 | 7/2008 | Ohuchi et al. | |
| 7,408,243 B2 | 8/2008 | Shiffer | |
| 7,452,743 B2 | 11/2008 | Oliver et al. | |
| 7,514,350 B2 | 4/2009 | Hashimoto | |
| 7,521,288 B2 | 4/2009 | Arai et al. | |
| 7,535,109 B2 | 5/2009 | Robinson et al. | |
| 7,564,142 B2 | 7/2009 | Hashimoto | |
| 7,595,222 B2 | 9/2009 | Shimoishizaka et al. | |
| 7,601,039 B2 | 10/2009 | Eldridge et al. | |
| 7,638,869 B2 | 12/2009 | Irsigler et al. | |
| 7,662,670 B2 | 2/2010 | Noma et al. | |
| 7,704,794 B2 | 4/2010 | Mess et al. | |
| 7,732,912 B2 | 6/2010 | Damberg | |
| 7,768,795 B2 | 8/2010 | Sakurai et al. | |
| 7,829,438 B2 | 11/2010 | Haba et al. | |
| 7,888,185 B2 | 2/2011 | Corisis et al. | |
| 7,901,989 B2 | 3/2011 | Haba et al. | |
| 7,919,846 B2 | 4/2011 | Hembree | |
| 7,952,195 B2 | 5/2011 | Haba | |
| 8,022,527 B2 | 9/2011 | Haba et al. | |
| 8,076,788 B2 | 12/2011 | Haba et al. | |
| 2001/0012725 A1 | 8/2001 | Maeda et al. | |
| 2001/0031548 A1 | 10/2001 | Elenius et al. | |
| 2002/0006686 A1 | 1/2002 | Cloud et al. | |
| 2002/0027257 A1 | 3/2002 | Kinsman et al. | |
| 2002/0045290 A1 | 4/2002 | Ball | |
| 2002/0096349 A1 | 7/2002 | Hedler et al. | |
| 2002/0127775 A1 | 9/2002 | Haba et al. | |
| 2002/0168798 A1 | 11/2002 | Glenn et al. | |
| 2002/0180010 A1 | 12/2002 | Tsubosaki et al. | |
| 2002/0185725 A1 | 12/2002 | Moden et al. | |
| 2002/0187260 A1 | 12/2002 | Sheppard et al. | |
| 2003/0038353 A1 | 2/2003 | Derderian | |
| 2003/0038356 A1 | 2/2003 | Derderian | |
| 2003/0038357 A1 | 2/2003 | Derderian | |
| 2003/0060034 A1 | 3/2003 | Beyne et al. | |
| 2003/0071338 A1 | 4/2003 | Jeung et al. | |

(56) References Cited

U.S. PATENT DOCUMENTS

| | | |
|---|---|---|
| 2003/0071341 A1 | 4/2003 | Jeung et al. |
| 2003/0080403 A1 | 5/2003 | Jeung et al. |
| 2003/0092326 A1* | 5/2003 | Nishikawa et al. ............ 439/894 |
| 2003/0096454 A1 | 5/2003 | Poo et al. |
| 2003/0099085 A1 | 5/2003 | Duva |
| 2003/0122243 A1 | 7/2003 | Lee et al. |
| 2003/0209772 A1 | 11/2003 | Prabhu |
| 2004/0113283 A1 | 6/2004 | Farnworth et al. |
| 2004/0142509 A1 | 7/2004 | Imai |
| 2004/0150095 A1 | 8/2004 | Fraley et al. |
| 2004/0173892 A1* | 9/2004 | Nakanishi ..................... 257/690 |
| 2004/0195667 A1 | 10/2004 | Karnezos |
| 2004/0198033 A1 | 10/2004 | Lee et al. |
| 2004/0212083 A1 | 10/2004 | Yang |
| 2004/0217446 A1 | 11/2004 | Headley et al. |
| 2004/0227235 A1 | 11/2004 | Hashimoto |
| 2004/0238933 A1 | 12/2004 | Chen et al. |
| 2004/0251520 A1 | 12/2004 | Sasaki et al. |
| 2004/0262035 A1* | 12/2004 | Ko et al. ....................... 174/260 |
| 2005/0013927 A1 | 1/2005 | Yamazaki |
| 2005/0067680 A1 | 3/2005 | Boon et al. |
| 2005/0067694 A1 | 3/2005 | Pon et al. |
| 2005/0082651 A1 | 4/2005 | Farnworth et al. |
| 2005/0085050 A1 | 4/2005 | Draney et al. |
| 2005/0101039 A1 | 5/2005 | Chen et al. |
| 2005/0104179 A1 | 5/2005 | Zilber et al. |
| 2005/0148160 A1 | 7/2005 | Farnworth et al. |
| 2005/0230802 A1* | 10/2005 | Vindasius et al. ............ 257/686 |
| 2005/0248021 A1 | 11/2005 | Morkner |
| 2005/0258530 A1 | 11/2005 | Vindasius et al. |
| 2005/0287705 A1 | 12/2005 | Yang |
| 2006/0003552 A1 | 1/2006 | Okada |
| 2006/0035408 A1 | 2/2006 | Derderian |
| 2006/0055050 A1 | 3/2006 | Numata et al. |
| 2006/0068567 A1 | 3/2006 | Beyne et al. |
| 2006/0076690 A1 | 4/2006 | Khandros et al. |
| 2006/0094165 A1 | 5/2006 | Hedler et al. |
| 2006/0097356 A1 | 5/2006 | Fujii et al. |
| 2006/0103000 A1* | 5/2006 | Kurosawa ..................... 257/690 |
| 2006/0121645 A1 | 6/2006 | Ball |
| 2006/0138626 A1 | 6/2006 | Liew et al. |
| 2006/0220262 A1 | 10/2006 | Meyer et al. |
| 2006/0267173 A1 | 11/2006 | Takiar et al. |
| 2006/0273365 A1 | 12/2006 | Cross et al. |
| 2006/0278971 A1 | 12/2006 | Barnes et al. |
| 2007/0065987 A1 | 3/2007 | Mess et al. |
| 2007/0102801 A1 | 5/2007 | Ishida et al. |
| 2007/0132082 A1 | 6/2007 | Tang et al. |
| 2007/0158799 A1 | 7/2007 | Chiu et al. |
| 2007/0158807 A1 | 7/2007 | Lu et al. |
| 2007/0170572 A1 | 7/2007 | Liu et al. |
| 2007/0181989 A1 | 8/2007 | Corisis et al. |
| 2007/0194462 A1 | 8/2007 | Kim et al. |
| 2007/0222054 A1 | 9/2007 | Hembree |
| 2007/0252262 A1 | 11/2007 | Robinson et al. |
| 2007/0284716 A1 | 12/2007 | Vindasius et al. |
| 2008/0083976 A1 | 4/2008 | Haba et al. |
| 2008/0083977 A1 | 4/2008 | Haba et al. |
| 2008/0112150 A1 | 5/2008 | Jones |
| 2008/0166836 A1 | 7/2008 | Jobetto |
| 2008/0173792 A1 | 7/2008 | Yang et al. |
| 2008/0180242 A1 | 7/2008 | Cottingham |
| 2008/0203566 A1 | 8/2008 | Su |
| 2008/0206915 A1 | 8/2008 | Yamazaki |
| 2008/0208043 A1 | 8/2008 | Smith et al. |
| 2008/0251913 A1* | 10/2008 | Inomata ......................... 257/737 |
| 2008/0284044 A1* | 11/2008 | Myers ............................ 257/777 |
| 2008/0303131 A1 | 12/2008 | McElrea et al. |
| 2008/0308921 A1 | 12/2008 | Kim |
| 2009/0020887 A1 | 1/2009 | Mizuno et al. |
| 2009/0020889 A1 | 1/2009 | Murayama et al. |
| 2009/0065948 A1 | 3/2009 | Wang |
| 2009/0102038 A1 | 4/2009 | McElrea et al. |
| 2009/0146137 A1 | 6/2009 | Kim et al. |
| 2009/0160065 A1 | 6/2009 | Haba et al. |
| 2009/0230528 A1 | 9/2009 | McElrea et al. |
| 2009/0316378 A1 | 12/2009 | Haba et al. |
| 2010/0140753 A1 | 6/2010 | Hembree |
| 2010/0207277 A1 | 8/2010 | Bauer et al. |
| 2011/0006432 A1 | 1/2011 | Haba et al. |
| 2011/0031629 A1 | 2/2011 | Haba et al. |
| 2011/0033979 A1 | 2/2011 | Haba et al. |
| 2011/0049696 A1 | 3/2011 | Haba et al. |
| 2011/0187007 A1 | 8/2011 | Haba et al. |
| 2011/0248410 A1 | 10/2011 | Avsian et al. |
| 2012/0061846 A1 | 3/2012 | Rathburn |
| 2012/0080807 A1 | 4/2012 | Haba et al. |
| 2012/0133057 A1 | 5/2012 | Haba et al. |
| 2013/0099392 A1 | 4/2013 | McElrea et al. |

FOREIGN PATENT DOCUMENTS

| | | |
|---|---|---|
| EP | 1041624 A1 | 10/2000 |
| EP | 1763894 A2 | 3/2007 |
| FR | 2704690 A1 | 11/1994 |
| JP | 07-509104 A | 10/1995 |
| JP | 11-260851 A | 9/1999 |
| JP | 2000269411 A | 9/2000 |
| JP | 2001210782 A | 8/2001 |
| JP | 2003-142518 A | 5/2003 |
| JP | 2003163324 A | 6/2003 |
| JP | 2004-119473 | 4/2004 |
| JP | 2004153130 A | 5/2004 |
| JP | 2004158536 A | 6/2004 |
| JP | 2004-214548 A | 7/2004 |
| JP | 2005005529 A | 1/2005 |
| JP | 2006-351793 A | 12/2006 |
| JP | 2007073803 A | 3/2007 |
| JP | 2007523482 A | 8/2007 |
| JP | 2008236688 A | 10/2008 |
| JP | 2009-026969 | 2/2009 |
| JP | 2009027039 A | 2/2009 |
| KR | 20-1994-0004952 | 7/1994 |
| KR | 10-1999-0008537 | 2/1999 |
| KR | 20010062722 A | 7/2001 |
| KR | 20050009036 A | 1/2005 |
| KR | 20070018057 A | 2/2007 |
| KR | 100813624 B1 | 3/2008 |
| KR | 20080045259 A | 5/2008 |
| KR | 20080069549 A | 7/2008 |
| WO | 9425987 A1 | 11/1994 |
| WO | 9907015 A1 | 2/1999 |
| WO | 9909599 A2 | 2/1999 |
| WO | 0164344 A2 | 9/2001 |
| WO | 2005101492 A2 | 10/2005 |
| WO | 2009052150 A1 | 4/2009 |
| WO | 2009114670 A2 | 9/2009 |

OTHER PUBLICATIONS

Amendment A filed Aug. 7, 2006 in response to Feb. 7, 2006 Office Action, U.S. Appl. No. 11/097,829.
EP Supplementary Search Report mailed Jun. 5, 2008, EP App. No. 05735136.3.
Office Action mailed Dec. 31, 2007, U.S. Appl. No. 11/744,153.
Amendment filed Apr. 1, 2008 in response to Dec. 31, 2007 Office Action , U.S. Appl. No. 11/744,153.
Final Office Action mailed Jul. 1, 2010, U.S. Appl. No. 11/744,153.
Amendment filed Oct. 1, 2008 in response to Jul. 1, 2010 Office Action, U.S. Appl. No. 11/744,153.
Advisory Action, mailed Oct. 20, 2008, App. No. 111744,153.
Amendment and RCE filed Nov. 26, 2008 in response to Oct. 20, 2008 Advisory Action, U.S. Appl. No. 11/744,153.
Notice of Allowance mailed Feb. 27. 2009, U.S. Appl. No. 11/744,153.
Office Action (Restriction) mailed Jan. 21, 2010, U.S. Appl. No. 12/046,651.
Amendment filed Feb. 22, 2010 in response to Feb. 21, 2010 Office Action, U.S. Appl. No. 12/046,651.
Office Action mailed Aug. 18, 2010, U.S. Appl. No. 12/046,651.
Amendment filed Jan. 18, 2011 in response to Aug. 18, 2010 Office Action, U.S. Appl. No. 12/046,651.

(56) References Cited

OTHER PUBLICATIONS

International Search Report for Application No. PCT/US2010/039639 dated Jan. 26, 2011.
Written Opinion of the International Searching Authority for Application No. PCT/US2010/039639 dated Jan. 26, 2011.
Ko, et al. Development of three-dimensional memory die stack packages using polymer insulated sidewall technique, 1999.
Office Action mailed Jun. 9, 2010, U.S. Appl. No. 12/251,624.
Amendment filed Dec. 9, 2010 in response to Jun. 9, 2010 Office Action, U.S. Appl. No. 12/251,624.
Final Office Action mailed Mar. 1, 2011, U.S. Appl. No. 12/251,624.
Office Action (Restriction) mailed May 24, 2010, U.S. Appl. No. 12/124,097.
Amendment filed Jun. 26, 2010 in response to May 24, 2010 Office Action, U.S. Appl. No. 12/124,097.
Office Action mailed Oct. 14, 2010, U.S. Appl. No. 12/124,097.
Amendment filed Feb. 14, 2011 in response to Oct. 14, 2010 Office Action, U.S. Appl. No. 12/124,097.
Notice of Allowability, mailed Oct. 19, 2006 U.S. Appl. No. 11/090,969.
Office Action (Restriction) mailed Apr. 20, 2009, U.S. Appl. No. 11/744,142.
Amendment filed May 22, 2009 in response to Apr. 20, 2009 Office Action, U.S. Appl. No. 11/744,142.
Office Action mailed Aug. 3, 2009, U.S. Appl. No. 11/744,142.
Amendment filed Dec. 3, 2009 in response to Aug. 3, 2009 Office Action, U.S. Appl. No. 11/744,142.
Final Office Action mailed Mar. 18, 2010, U.S. Appl. No. 11/744,142.
Notice of Appeal filed Sep. 16, 2010 in response to Mar. 18, 2010 Office Action, U.S. Appl. No. 11/744,142.
Amendment and RCE filed Mar. 16, 2011 in response to Mar. 18, 2010 Office Action, U.S. Appl. No. 11/744,142.
Final Office Action mailed Jan. 8, 2007, U.S. Appl. No. 11/097,829.
Amendment filed Jan. 24, 2007 in response to Jan. 8, 2007 Office Action, U.S. Appl. No. 11/097,829.
Notice of Allowance, mailed Feb. 12, 2007, U.S. Appl. No. 11/097,829.
Notice to File Corrected Papers, mailed Mar. 30, 2007, U.S. Appl. No. 11/097,829.
Amendment filed May 29, 2007 in response to Mar. 30, 2007 Notice, U.S. Appl. No. 11/097,829.
Office Action (Restriction) mailed Dec. 28, 2010, U.S. Appl. No. 12/403,175.
Amendment filed Apr. 11, 2008 in response to Dec. 31, 2007 Office Action, U.S. Appl. No. 11/744,153.
Advisory Action, mailed Oct. 20, 2008, U.S. Appl. No. 11/744,153.
Notice of Allowance mailed Feb. 27, 2009, U.S. Appl. No. 11/744,153.
Office Action (Restriction) mailed Oct. 7, 2009, U.S. Appl. No. 12/143,157.
Amendment filed Nov. 9, 2009 in response to Oct. 7, 2009 Office Action, U.S. Appl. No. 12/143,157.
Office Action mailed Dec. 30, 2009, U.S. Appl. No. 12/143,157.
Amendment filed Jun. 30, 2009 in response to Dec. 30, 2009 Office Action, U.S. Appl. No. 12/143,157.
Final Office Action, mailed Aug. 5, 2010, U.S. Appl. No. 12/143,157.
Amendment and RCE filed Feb. 7, 2011 in repsonse to Aug. 5, 2010 Office Action, U.S. Appl. No. 12/143,157.
Office Action mailed Mar. 1, 2011, U.S. Appl. No. 12/143,157.
Amendment filed Jan. 29, 2010 in response to Dec. 28, 2010 Office Action, U.S. Appl. No. 12/403,175.
Office Action (Restriction) mailed Feb. 4, 2010, U.S. Appl. No. 12/251,624.
Amendment filed Mar. 4, 2010 in response to Feb. 4, 2010 Office Action, U.S. Appl. No. 12/251,624.
International Search Report and Written Opinion for Application No. PCT/US2009/047389 dated Jan. 14, 2010.
International Search Report and Written Opinion for Application No. PCT/US2010/054325 dated Jul. 28, 2011.
International Search Report for Application No. PCT/US2009/067386 dated Jul. 1, 2010.
Written Opinion of the International Searching Authority for Application No. PCT/US2009/067386 dated Jul. 1, 2010.
International Search Report for Application No. PCT/US2010/055472 dated Jul. 27, 2011.
Written Opinion of the International Searching Authority for Application No. No. PCT/US2010/055472 dated Jul. 27, 2011.
International Search Report for PCT Application No. PCT/US2008/065793, mailed Dec. 22, 2008.
International Search Report and Written Opinion for PCT Application No. PCT/US2008/065788, mailed Sep. 30, 2008.
International Search Report & Wrillen Opinion, Application N90. PCT/US2008/066561, dated Dec. 31, 2008.
EP Supplementary Search Report dated Jun. 5, 2008 and mailed Jun. 12, 2008 for EP App. No. 05735136.3.
International Search Report and Wrillen Opinion, Appl. No. PCT/US2008/067722, dated Feb. 25, 2009.
International Search Report and Written Opinion dated Mar. 17, 2009, App. No. PCTIUS2008/079948.
International Search Report and Written Opinion dated Mar. 6, 2009, App. No. PCT/US2008/173365.
International Search Report and Written Opinion dated Oct. 6, 2009, App. No. PCTIUS2009136921.
International Search Report and Written Opinion dated Apr. 12, 2010, App. No. PCTIUS2009/55421.
International Search Report and Written Opinion dated Jan. 26, 2011, App. No. PCT/US2010/39639.
International Search Report mailed Mar. 23, 2009, International Application No. PCT/US2008/74450.
Office Action mailed Dec. 22, 2006, U.S. Appl. No. 11/016,558.
Amendment filed Jun. 21, 2007 in response to Dec. 22, 2006 Office Action, U.S. Appl. No. 11/016,558.
Final Office Action mailed Jul. 19, 2007, U.S. Appl. No. 11/016,558.
Amendment filed Sep. 19, 2007 in response to Jul. 19, 2007 Office Action, U.S. Appl. No. 11/016,558.
Advisory Action mailed Oct. 10, 2007, U.S. Appl. No. 11/016,558.
Response filed Oct. 19, 2007 to Oct. 10, 2007 Advisory Action, U.S. Appl. No. 11/016,558.
Amendment filed Jan. 22, 2007 in response to Jul. 19, 2007 Office Action, U.S. Appl. No. 11/016,558.
Office Action mailed Mar. 27, 2008, U.S. Appl. No. 11/016,558.
Amendment filed Jun. 27, 2008 in response to Mar. 27, 2008 Office Action, U.S. Appl. No. 11/016,558.
Final Office Action mailed Sep. 15, 2008, U.S. Appl. No. 11/016,558.
Amendment filed Oct. 14, 2008 in response to Sep. 15, 2008 Office Action, U.S. Appl. No. 11/016,558.
Office Action mailed Dec. 15, 2008, U.S. Appl. No. 11/016,558.
Amendment filed Apr. 8, 2009 in response to Dec. 15, 2008 Office Action, U.S. Appl. No. 11/016,558.
Office Action mailed Jul. 15, 2009, U.S. Appl. No. 11/016,558.
Response filed Aug. 5, 2009 in response to Jul. 15, 2009 Office Action, U.S. Appl. No. 11/016,558.
Notice of Allowance mailed Dec. 17, 2009, U.S. Appl. No. 11/016,558.
EP Supplemental Search Report mailed Nov. 5, 2007, EP Application No. 05736129.7.
Office Action mailed Mar. 19, 2008, EP Application No. 05736129.7.
Office Action mailed Jan. 27, 2009, U.S. Appl. No. 11/849,162.
Amendment filed Mar. 27, 2009 in response to Jan. 27, 2009 Office Action, U.S. Appl. No. 11/849,162.
Office Action (Restriction) mailed Jun. 24, 2009, U.S. Appl. No. 11/849,162.
Amendment filed Jul. 8, 2009 in response to Jun. 24, 2009 Office Action, U.S. Appl. No. 11/849,162.
Supplemental Amendement filed Aug. 5, 2009, App. No. 111849,162.
Office Action (Restriction) mailed Oct. 7, 2009, U.S. Appl. No. 11/849,162.
Amendment filed Nov. 9, 2009 in response to Oct. 7, 2009 Office Action, U.S. Appl. No. 11/849,162.
Office Action mailed Jul. 21, 2010, U.S. Appl. No. 11/849,162.

(56) References Cited

OTHER PUBLICATIONS

Amendment filed Jan. 21, 2011 in response to Jul. 21, 2010 Office Action, U.S. Appl. No. 11/849,162.
*Ex Parte Quayle* Action mailed Feb. 17, 2006, U.S. Appl. No. 11/090,969.
Amendment A filed Aug. 7, 2006 in response to Feb. 7, 2006 Quayle Action, U.S. Appl. No. 11/090,969.
Notice of Allowability, mailed Oct. 19, 2006, U.S. Appl. No. 11/090,969.
Japanese Office Action for Application No. 2010-550853 dated Sep. 18, 2013.
Chinese Office Action for Application No. 200980149285.2 dated Feb. 28, 2014.
Japanese Office Action for Application No. 2011540873 dated Jan. 22, 2014.

* cited by examiner

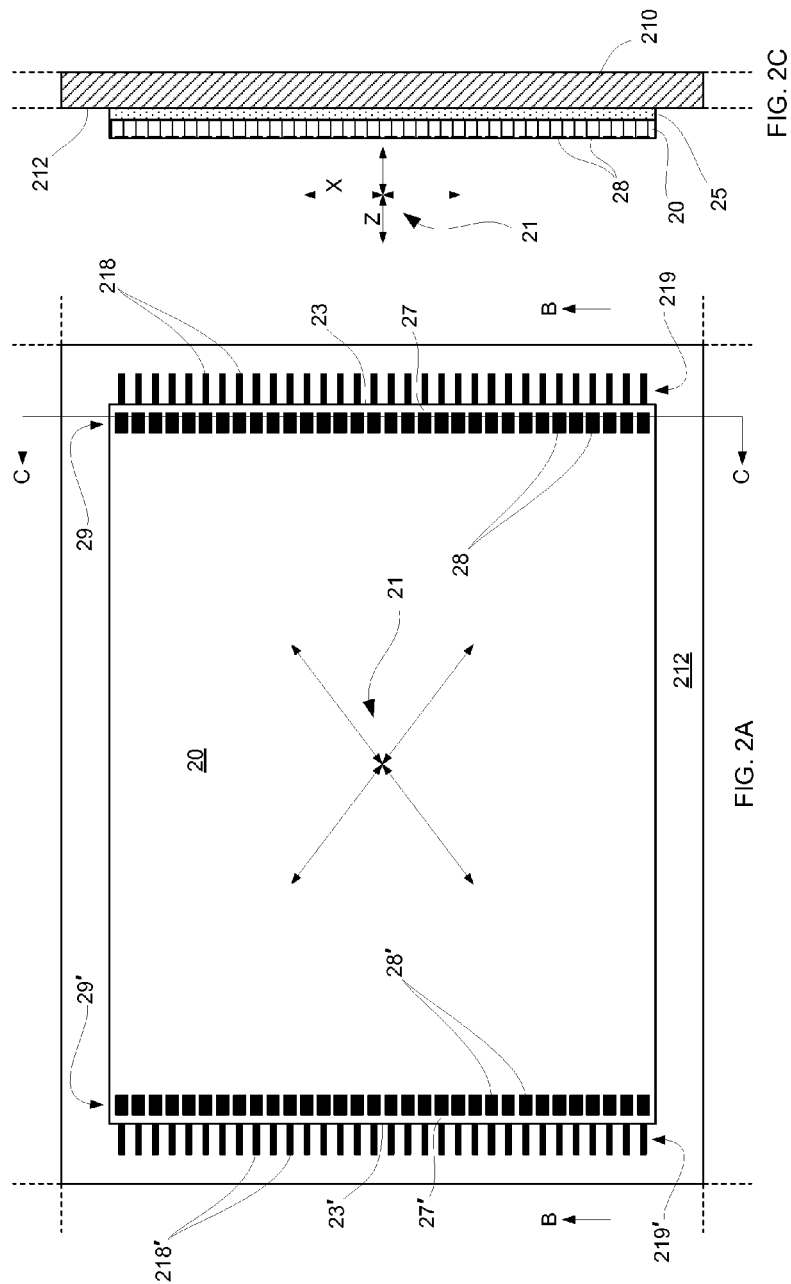

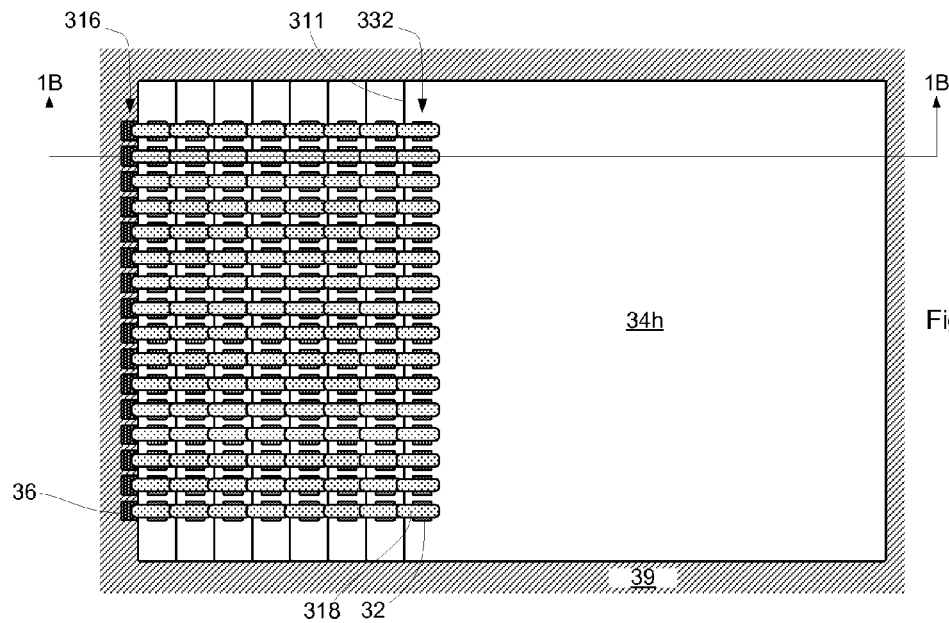
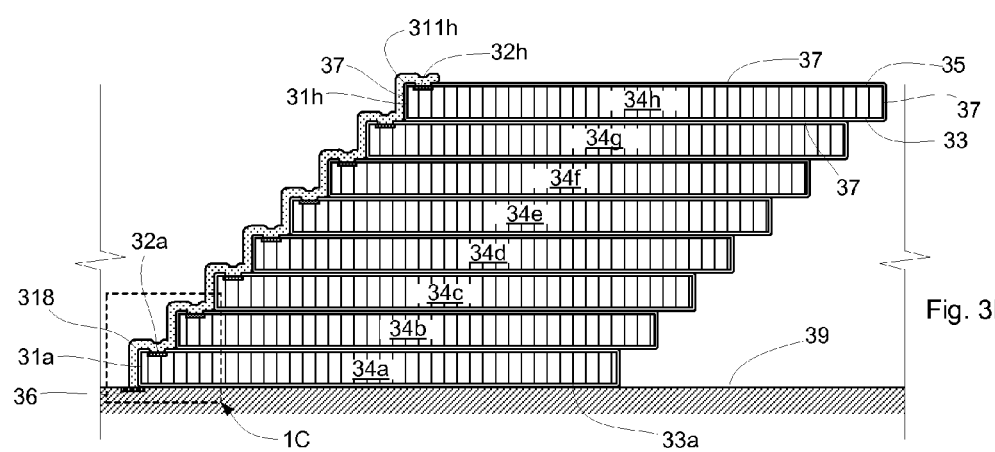
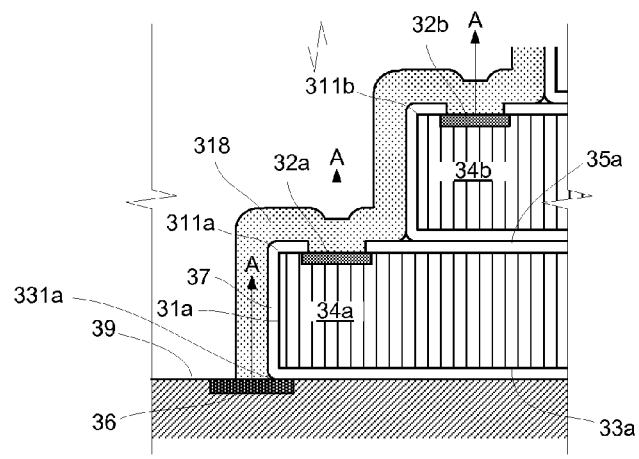
Fig. 3A
Fig. 3B
Fig. 3C

STACKED DIE ASSEMBLY HAVING REDUCED STRESS ELECTRICAL INTERCONNECTS

CROSS-REFERENCE TO RELATED APPLICATIONS

This application claims priority from S. McGrath et al. U.S. Provisional Application No. 61/280,584, filed Nov. 4, 2009, titled "Stacked die assembly having reduced stress electrical interconnects", which is hereby incorporated by reference.

BACKGROUND

This invention relates to electrical connection of semiconductor die to circuitry in a support and, particularly, to electrical connection of a stack of electrically interconnected die to circuitry in a support.

A typical semiconductor die has a front ("active") side, in which the integrated circuitry is formed, a back side, and sidewalls. The sidewalls meet the front side at front edges and the back side at back edges. Semiconductor die typically are provided with interconnect pads (die pads) located at the front side for electrical interconnection of the circuitry on the die with other circuitry in the device in which the die is deployed. Some die as provided have die pads on the front side along one or more of the die margins, and these may be referred to as peripheral pad die. Other die as provided have die pads arranged in one or two rows at the front side near the center of the die, and these may be referred to as central pad die. The die may be "rerouted" to provide a suitable arrangement of interconnect pads at or near one or more of the margins of the die.

Semiconductor die may be electrically connected with other circuitry, for example in a printed circuit board, a package substrate or leadframe, or another die, by any of several means. Such z-interconnection may be made, for example, by wire bonds, or by flip chip interconnects, or by tab interconnects. The package substrate or leadframe provides for electrical connection of the package to underlying circuitry (second-level interconnection), such as circuitry on a printed circuit board, in a device in which the package is installed for use.

A number of approaches have been proposed for increasing the density of active semiconductor circuitry in integrated circuit chip packages, while minimizing package size (package footprint, package thickness). In one approach to making a high density package having a smaller footprint, two or more semiconductor die, of the same or different functionality, are stacked one over another and mounted on a package substrate.

Electrical interconnection of stacked semiconductor die presents a number of challenges. For instance, two or more die in a stack may be mounted on a substrate with their front sides facing away from the substrate, and connected by wire bonds die-to-substrate or die-to-die. Die-to-die wire bond interconnect may be made where an upper die is dimensioned or located so that the upper die does not overlie the margin of the lower die to which it is connected, and so that sufficient horizontal clearance is provided for the wire span. This condition may pertain, for example, where the footprint of the upper die is sufficiently narrower than the lower die; or, for example, where the upper die is arranged so that the footprint of the upper die is offset in relation to the margin of the lower die. Alternatively, the die in the stack may be indirectly interconnected by connecting them to a common substrate on which the stack is mounted. Where a lower die in a stack is wire bonded die-to-substrate, and where the footprint of an upper die overlies the margin of the lower die, a spacer may be interposed to provide sufficient vertical clearance between the lower and the upper die to accommodate the wire loops over the lower die. The spacer adds to the thickness of the stack and, consequently, of the package. Moreover, in such a configuration the wire bond die-to-substrate connection of the lower die must be completed before the spacer and the upper die are stacked over it; that is, the die must be stacked in situ on the substrate and the die must be stacked and connected serially.

S. J. S. McElrea et al. U.S. application Ser. No. 12/124,077, filed May 20, 2008, titled "Electrically interconnected stacked die assemblies", incorporated herein by reference, describes stacked die configurations in which interconnect pads on the die are electrically connected by traces of an electrically conductive interconnect material. In some configurations adjacent die in the stack are provided with interconnect pads arranged at the front side along a die margin, and the edge at the margin of an overlying die is offset in relation to the margin of the die beneath it. The offset reveals at least a fraction of the area of the interconnect pads on the lower die, so that the pads on the lower die are available for electrical connection with pads on a die situated above. The electrically conductive interconnect material is an electrically conductive polymer, such as a curable conductive epoxy, for example.

T. Caskey et al. U.S. application Ser. No. 12/124,097, filed May 20, 2008, titled "Electrical interconnect formed by pulse dispense", incorporated herein by reference, describes methods for electrical interconnection of die in a stack, and of stacked die with a substrate, by depositing an electrical interconnect material in situ in a series of pulses to form an electrically continuous interconnection. The interconnect material may be a curable material, and may be deposited in an uncured or partially cured state; and the material may be partially or additionally cured at an intermediate stage following dispense, and may be fully cured when dispense has been completed. Suitable interconnect materials include polymers filled with conductive material in particle form such as, for example, metal-filled polymers, including, for example metal filled epoxy, metal filled thermosetting polymers, metal filled thermoplastic polymers, or electrically conductive inks.

The quality of the die-to-die electrical connection depends in part upon the electrical continuity between the interconnect and the die pads, and in part upon the mechanical integrity of the interconnect traces. There is a general trend toward finer interconnect pad pitch and, accordingly, toward smaller interconnect pad area. Where the interconnect material is a polymer filled with electrically conductive particles, such as a silver-filled epoxy, for example, the electrical continuity between the die pad and the interconnect material depends upon the adhesion of the interconnect material with the pad surface.

Stacked die assemblies and stacked die packages must be capable of withstanding temperature changes during operation. The thermal expansion characteristics differ among the various materials in the package, and thermal cycling of the construct can result in fatigue-driven degradation of the interconnect trace itself, or of the contact between the die pad or the bond pad and the interconnect trace.

SUMMARY

This application discloses stacked die assemblies in which interconnect failure is reduced by any of a variety of approaches. The stacked die assemblies include die stacked over a support such as a substrate, in which pads on the die are electrically interconnected and are electrically connected to circuitry in the support by traces formed of an electrically conductive material. Suitable electrically conductive materials include materials that can be applied in a flowable form and then cured or allowed to cure to form the electrically conductive traces. Such materials include, for example, electrically conductive polymers, including electrically conductive particulates (e.g., conductive metal particles) contained in a curable organic polymer matrix (for example, conductive (e.g., filled) epoxies, or electrically conductive inks); and include, for example, electrically conductive particulates delivered in a liquid carrier. In particular embodiments the interconnect material is a conductive polymer such as a curable conductive polymer, or a conductive ink.

The support to which the die are electrically connected can be a circuit board, or a package substrate, or a leadframe. Suitable package substrates include, for example, a ball grid array ("BGA") or land grid array ("LGA") substrate, or a flex tape substrate.

Thermal expansion characteristics (particularly, coefficient of thermal expansion, or "CTE") differ among the various materials in the assembly, and thermal cycling of the construct can result in fatigue-driven degradation of the contact between the die pad and the interconnect. The different CTEs of the materials making up the various components can cause the components to tend to expand or contract to different extents over a range of temperatures. Where the various components of the assembly are securely affixed to one another, this differential expansion/contraction can result in a warping of the assembly or of some of the parts of the assembly. This effect can be particularly problematic where the die in the stack are very thin. The warp may produce a convex upper die surface, or a concave upper die surface, depending upon the particular materials and the particular temperature cycle. This can result in interconnect failures by, for example, cracking or breaking of interconnect traces; or by complete or partial separation (delamination) of the traces from the die pad or the bond pad.

Computer modeling and stress analysis and testing have suggested or shown some patterns in the location of interconnect failures. For example, in at least some stacked die assemblies, the interconnect failure may be located in pads near the corners of the die. And, for example, in at least some stacked die assemblies, the interconnect failure is located at some point between the die pad on the bottom die in the stack and the bond pad on the substrate. The interconnect trace may, for example, be partly or entirely delaminated from the die pad, or from the bond pad; or, for example, the interconnect trace itself may be cracked or broken, near the inside corner where the back side die edge on the interconnect sidewall meets the substrate.

Computer modeling and stress analysis and testing have further suggested that the robustness of the electrical connection of the interconnect material with a die pad or bond pad can be better at some sites on the pad than at others. Particularly, depending upon the particular configuration of the die stack, a more robust connection may result if made at a site in the pad nearer the die edge; or nearer the inside corner where the back side die edge on the interconnect sidewall of the bottom die meets the die attach side of the underlying substrate, or where the back side die edge on the interconnect sidewall of an upper die meets the active side of an underlying die.

The various approaches, described below, address interconnect failure challenges.

In one approach, the bottom die in the stack has a greater thickness than the other die in the stack. This may be accomplished during the manufacture of the bottom die at the wafer level, by, for example, leaving the bottom die wafer thicker following backgrinding than the other die. The bottom die may have the same (or similar) functionality as the other die in the stack; or, the bottom die may have a functionality different from that of the other die in the stack. The greater thickness provides increased stiffness to the stack, and can help to reduce warping or bending.

In another approach, a nonfunctional die is situated between the lowest functional die in the stack and the support. The nonfunctional die may in some configurations be configured substantially the same as the lowest functional die in the stack; in some such configurations the interconnects may not contact the pads on the additional die; or, in some such configurations the pads may be disabled (for example they may be covered by a dielectric material, so that the additional die is not electrically connected to overlying interconnect traces). In some configurations the nonfunctional die may be an additional die; in other configurations the nonfunctional die is a "sacrificial" bottom die of a stack, rendered nonfunctional by being disabled.

In another approach, zones near the corners of the die are left free of electrical connection. In some configurations the "keepout" zones may constitute portions of the interconnect margin of the die at which no pads are situated. This arrangement may be designed into the placement of pads in a rerouting pattern; or, this arrangement may result during the die singulation process, by cutting the die wider than would be minimally required for the circuitry and the pad arrangement. In some configurations the "keepout" zone may constitute disabling interconnection to pads at one or a few die pad positions ("sacrificial pad positions") near the affected corner. For example the die pads in the sacrificial pad positions may be disabled (for example they may be covered by a dielectric material), so that the die is not electrically connected to overlying interconnect traces in the keepout zones. In some configurations connection of die pads in the sacrificial pad positions to corresponding bond pads may be prevented by disabling bond pads at the corresponding positions on the substrate, or by designing the substrate so that no bond pads are located there.

In another approach, where the assembly is to be molded or encapsulated, cure of the interconnect material is completed following the molding or encapsulation procedure. Following deposition of the interconnect material in flowable form, a partial cure may be carried out. Thereafter molding or encapsulation is carried out, so that final cure of the interconnect material is delayed until after the assembly has been to some extent stabilized by the molding or encapsulation. Typically, where cure of both the molding compound or encapsulant and the interconnect material is completed by heating, and the cure processes for each may have different temperature schedules, the schedule can be manipulated according to the cure requirements for the particular materials employed.

In a further approach in which cure of the interconnect material is completed following the molding or encapsulation procedure, the molded or encapsulated assembly can be pre-stressed during final cure to provide a counteracting warp or bend in the structure. That is, where testing or modeling of a particular assembly suggests that thermal stress is likely to produce a concave upper die surface, the mold cavity is configured so that when the assembly is pressed into the cavity the assembly is flexed to form a convex upper die surface and held in that state during final cure; or, where testing or modeling of a particular assembly suggests that thermal stress is likely to produce a convex upper die surface, the mold cavity is configured so that when the assembly is pressed into the cavity the assembly is flexed to form a concave upper die surface and held in that state during final cure.

Some types of interconnect failure can result from transverse cracks in the trace, which typically propagate from a surface of the trace material, and which may occur during molding or encapsulation. Accordingly, in another approach, particularly for example where the assembly is to be molded or encapsulated, the interconnect traces can be coated with a film of a material such as a polymer (for example, a parylene or a silicone rubber) prior to the encapsulating or molding procedure. Apparently (without limitation) the film provides a sort of relief or lubrication at the interface of the interconnect material and the molding material or encapsulant, and thereby reduces stresses, for example during stress testing, that may result in crack formation.

In another approach, where modeling suggests that more robust electrical connection may be obtained on particular sites on a die pad or bond pad ("preferred sites"), electrical connection is directed to the preferred sites. Particularly, for example stress analysis of a particular assembly configuration may suggest that at some sites on a die pad or bond pad the electrical connection (that is, the joint between the conductive trace and the pad) will be under compression, while at other sites on the pad the electrical connection will be under tension. Electrical connections that are under compression are likely to be more robust. Accordingly the interconnect material is applied to particularly contact the preferred sites. In some configurations, where a dielectric coating is provided, with openings over areas that are to be contacted by the interconnect trace, this is accomplished by forming the openings particularly over the preferred sites.

In another approach, an underfill is formed between the bottom die in the stack and the substrate. The underfill is deposited near one or more edges of the bottom die. The underfill reinforces the adhesion of the die stack to the substrate, and helps prevent or reduce delamination along the edge. The underfill may be applied in particular spots, at intervals along the edge, or continuously along the edge. Where an electrically non-conductive underfill is used, it can be deposited at or along any of the die edges, in some configurations a non-conductive underfill is deposited at spots along the die interconnect sidewall, usually generally between the bond pads; and in some configurations the non-conductive underfill is deposited in a continuous line along one or more of the non-interconnect sidewalls. Where an electrically conductive underfill is used, it can be deposited at any location where the underfill will not cause electrical shorting. In some configurations an underfill is deposited at or near the corners of the bottom die, away from any electrically conductive features in the die or at the substrate surface.

In another approach, an underfill is deposited at the inside angle formed by a die sidewall and an underlying surface. The die sidewall can be, for example, the interconnect sidewall of the bottom die; and the underlying surface can be, for example, an area of the die attach side of the substrate, inboard of the bond pads and adjacent the die sidewall. Or, for example, the interconnect sidewall can be the interconnect sidewall of an upper die; and the underlying surface can be, for example, an electrically insulated area of the front side of an underlying die, inboard of the die pads on the underlying die and adjacent the upper die sidewall. Or, for example, the die sidewall can be a sidewall of a flip chip die oriented die-down on the substrate and electrically connected to the substrate in the die footprint, and the underlying surface can be, for example, an electrically insulated area of the die attach side of the substrate, inboard of the bond pads and adjacent the die sidewall. Or, for example, the interconnect sidewall can be the interconnect sidewall of a die stacked over a flip chip die; and the underlying surface can be, for example, an electrically insulated area of the back side of the underlying flip chip die. Or, for example, the underfill can be deposited at the inside angle formed by a sidewall of a molded package, such as a chip scale package. The underfill may be formed so that it forms a fillet approximating a right triangular shape in transverse section; viewed in this way the hypotenuse of the triangle shape is a sloping surface over which an interconnect trace can be formed; and a vertical side of the triangle forms an angle with the hypotenuse at or near the upper die interconnect edge. The sloping surface of the fillet may be slightly concave or convex, or may be a more complex slightly curved surface. The underfill can be CTE matched, to help stabilize the assembly, reducing delamination effects. Moreover, the underfill, shaped as described above, can provide a gradual transition from die-to-die or from die-to-substrate, eliminating abrupt angular (approximately right-angle) transitions at the interconnect edges of the die and at the inside corners where the back edge of the die sidewall meets the underlying surface. In some configurations, a first underfill fillet formed at the sidewall of a bottom die and a substrate can support a first set of electrical interconnect traces connecting pads on the bottom die with bond pads in a first row on the substrate; and an additional underfill fillet formed over the first interconnect traces on the first fillet at the sidewall of an upper die and the bottom die can support a second set of interconnect traces from die pads on the upper die to bond pads in a second row, outboard from the first row, on the substrate.

Further approaches can be employed where the underfill is formed at the inside angle of a sidewall of a flip chip die oriented die-down on the substrate and electrically connected to the substrate in the die footprint, and the underlying surface is an electrically insulated area of the die attach side of the substrate, inboard of the bond pads and adjacent the die sidewall, to assist in constraining the flow ("run-out" or "bleed") of the underfill material over the substrate.

In one such approach, a dam is formed prior to depositing the underfill material, to prevent or limit flow of the underfill laterally—that is, to limit or prevent flow of the underfill material in a direction generally parallel to the row of bond pads on the substrate. The dam material may be a curable material applicable in a flowable form and thereafter cured or allowed to cure. The dam material may have properties that make it generally less likely than the underfill material to flow (run-out or bleed) when in an uncured state. The dam material may have a higher viscosity, for example, than the underfill material. The dam material and the underfill material may be cured in the same cure procedure, or the dam material may be cured in an earlier cure procedure.

In another such approach, where the die attach side of the substrate is covered by a solder mask, a trench may be formed in the solder mask, having a trench wall situated generally parallel to the row of bond pads on the substrate, to limit the flow of underfill material toward the bond pads, and thereby to prevent run-out or bleed of the underfill material over the bond pads. The advancing front of the flowing underflow material can be substantially halted at the trench wall edge.

The die, packages, and assemblies according to the invention can be used in computers, telecommunications equipment, and consumer and industrial electronics devices.

BRIEF DESCRIPTION OF THE DRAWINGS

FIG. 2A is a diagrammatic sketch in a plan view showing a die mounted onto a support as in FIG. 1.

FIGS. 2B and 2C are diagrammatic sketches in sectional views showing a die mounted onto a support as in FIG. 1, as indicated at B-B and C-C, respectively.

FIGS. 3A and 3B are diagrammatic sketches showing an offset die stack mounted on and electrically connected to a support, in plan view (FIG. 3A) and in a sectional view (FIG. 3B).

FIG. 3C is a diagrammatic sketch showing a portion of the sectional view of FIG. 3B, enlarged.

FIG. 10B is a partial plan view; and FIG. 10A is a sectional view taken at A-A in FIG. 10B.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs. Also for clarity of presentation certain features are not shown in the FIGs., where not necessary for an understanding of the invention. At some points in the description, terms of relative positions such as "above", "below", "upper", "lower", "top", "bottom" and the like may be used, with reference to the orientation of the drawings; such terms are not intended to limit the orientation of the device in use.

Figure 1:
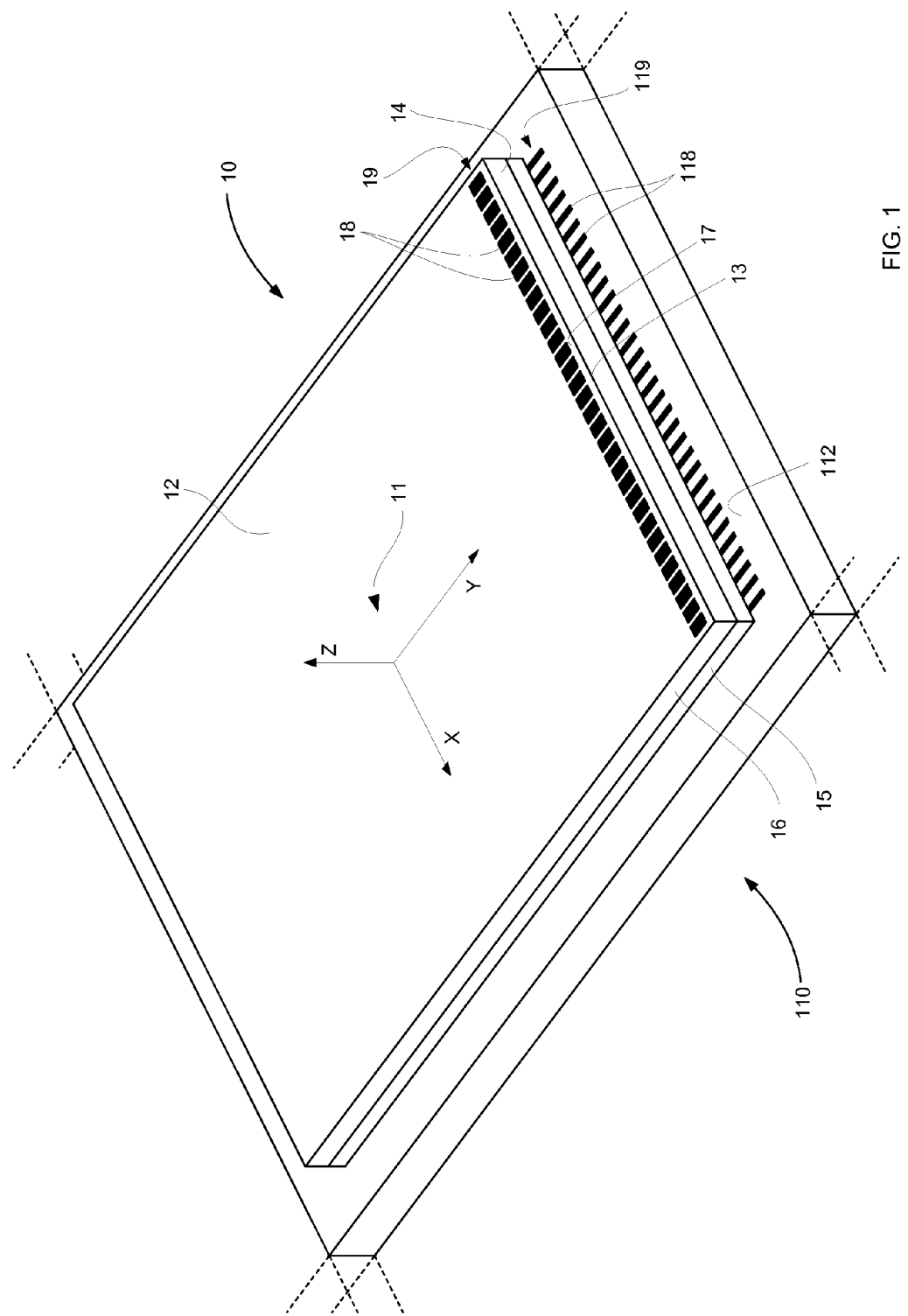
FIG. 1 is a diagrammatic sketch in a perspective view showing a die mounted onto a support.

Turning now to FIG. 1, there is shown in a perspective view a semiconductor die 10 mounted over a substrate 110. The die 10 has two larger generally parallel, generally rectangular sides, and four sidewalls. One larger side may be referred to as the front side, and the other may be referred to as the back side. The circuitry of the die is situated at or near the die surface at the front side, and so the front side may be referred to as the active side of the die. In the view presented in FIG. 1 the die 10 is shown with the active side facing away from the substrate 110, so that the front side 12 of die 10 is visible. Also visible in the view shown in FIG. 1 are sidewalls 14 and 16 of die 10. Margins of the die are adjacent the sidewalls; for example, margin 17 is adjacent the sidewall 14 on the front side 12 of die 10. The intersection of a die sidewall and the front side define a front edge; for example front edge 13 is defined at the intersection of die sidewall 14 and the front side 12. Interconnect pads are arranged in a margin along a front edge; in the example shown here pads 18 are arranged in a row 19 in or near the margin 17 along a front edge 13 of die 10. A die edge along which pads are arranged may be referred to as an "interconnect edge", and the adjacent margin and die sidewall may be referred to as an "interconnect margin" and an "interconnect sidewall", respectively.

In the example shown in FIG. 1 the die 10 is mounted onto a die attach side 112 of the substrate 110 by means of a die attach film 15. Typically a number of substrates are formed in one or more rows in a strip and subsequently separated by sawing or punching. In the example shown bond pads 118 are arranged in a row 119 at the die attach side 112 of the substrate 110, and the die is situated so that the die pads 18 are generally aligned with corresponding bond pads 118 on the substrate. Electrical connection (not shown in FIG. 1) of the die pads 18 with corresponding bond pads 118 is made by applying traces of an electrically conductive material in a flowable form over the respective die pads and bond pads, and then curing the material (or allowing the material to cure) to complete the interconnect.

For reference, the directional axes X and Y parallel to, and Z perpendicular to, the plane of the larger sides of the die (and the plane of the die attach side of the substrate) are indicated at 11 in FIG. 1 and at 21 in FIGS. 2A, 2B and 2C.

The various materials in an assembly such as is illustrated for example in FIG. 1 may have different thermal expansion characteristics (different coefficients of thermal expansion, "CTE"). Particularly, there may be a CTE mismatch between the die (silicon) and the die attach film. Thermal cycling of the construct can cause stresses and strains in the construct, which may result in fatigue-driven degradation of the contact between the interconnect and the die pads or the bond pads, or of the interconnect itself.

FIGS. 2A, 2B and 2C show a die 20 mounted on a substrate 210 in plan view (FIG. 2A) and in sectional views (FIGS. 2B, 2C). In the example shown here, the die 20 is mounted onto a die attach side 212 of the substrate 210 by means of a die attach film 25. In this example, die pads 28, 28' are arranged in rows 29, 29' along interconnect margins 27, 27' at opposite front die edges 23, 23'. Corresponding bond pads 218, 218' are arranged in rows 219, 219' at the die attach side 212 of the substrate, and the die is situated so that the die pads 118, 118' are generally aligned with corresponding bond pads 218, 218' on the substrate. Electrical connection (not shown in these FIGs.) of the die pads 118, 118' with corresponding bond pads 218, 218' is made by applying traces of an electrically conductive material in a flowable form over the respective die pads and bond pads, and then curing the material (or allowing the material to cure) to complete the interconnect. The tendencies of the various components to contract or expand in relation to one another is illustrated by the arrows 21.

The tendencies of the various components to expand or contract differently can result in relative movement of the parts; for example, the die edges may move in relation to the underlying substrate. More usually, where the various components are securely affixed to one another, the tendencies of the various components to expand or contract differently can result in a curling or warping of the structure or of parts of the structure. This distortion of the shape can cause failure of some interconnections, by causing a crack or break in the interconnect itself, or by partial or complete delamination of the interconnect from one or more pads.

S. J. S. McElrea et al. U.S. patent application Ser. No. 12/124,077, filed May 20, 2008, titled "Electrically interconnected stacked die assemblies", which is incorporated herein by reference, describes among other things stacked die assemblies in which successive die in the stack are offset at a die edge at which die pads are situated, and the die are interconnected by electrically conductive traces. The electrically conductive traces are formed of a material that is applied in a flowable form and subsequently cured or allowed to cure. Examples of such materials include electrically conductive polymers such as filled polymers, for example filled epoxies or electrically conductive inks.

FIG. 3A shows in a plan view an arrangement of offset stacked die 34a-34h, each die having interconnect pads arranged in one margin adjacent a front die edge; and FIG. 3B shows the stack in a sectional view as indicated at 1B-1B in FIG. 3A. Referring to the uppermost die 44h in the stack, for example, interconnect pads 32 are in this example situated in a row 312 alongside a front die edge 311. The die 34h in this example is covered on all surfaces (back surface 33, front surface 35, sidewalls 31) by an electrically insulative conformal coating 37, provided with openings exposing interconnect pads 32. Successive coated die in the stack may, as in these examples, rest directly one upon another, such that the coating on the back side of an upper die can contact the coating on the front side of the underlying die. Optionally, or additionally, a die attach film may be laminated onto the back side of one or more of the die.

In the example shown in FIGS. 3A and 3B each die has interconnect pads situated in a margin along one front die edge (an "interconnect" edge), and succeeding die in the stack are arranged so that their respective interconnect edges face toward the same face of the stack. Successive die in the stack are displaced (offset) in a direction orthogonal to the die edge along which the pads are situated, and in the example shown here the offset leaves the pads in each underlying die fully exposed. This configuration presents as a stairstep die stack, and electrical interconnections are made over the steps.

The stack is mounted on a support (for example, a package substrate) having a row 316 of bond sites 36 exposed at a die mount surface 39. The bond sites are connected to (or constitute a part of) electrical circuitry (not shown in the FIGs.) in the support. The die stack is affixed to the die mount surface 39 of the substrate, and arranged so that the front sidewall 31a of a first die 34a is aligned along the row 316 of bond sites 36. The coated back side of the first die may, as in these examples, directly contact the support surface 39 and may serve to affix the stack to the support. Optionally, a die attach film may be laminated onto the back side of the first die to serve to affix the stack to the support.

The die are electrically interconnected (die-to-die) in the stack, and the stack is electrically connected to the support, by traces 318 of an interconnect material disposed in contact with die pads and bond pads. The interconnect material may be an electrically conductive polymer, such as a polymer matrix containing particles of an electrically conductive material. The material may a curable polymer, for example, such as electrically conductive epoxy (for example, a silver filled epoxy); and the interconnection may be made by forming traces of the uncured material in a prescribed pattern and thereafter curing the polymer to secure the electrical contacts with the die pads and the bond sites, and to ensure the mechanical integrity of the traces between them.

FIG. 3C shows a portion (indicated by the broken outline 3C in FIG. 3B) of a stack as in FIGS. 3A and 3B enlarged. The die are covered on all surfaces by an electrically insulative conformal coating; that is, for example, the back surface 33a, the front surface 35a, and the sidewall 31a of die 34a are covered by conformal coating 37. The coating is provided with openings exposing the interconnect pads 32a. The die are offset; that is, for example, the edge 311b of die 34b is set back (to the right in the FIG.) in relation to edge 311a of die 34a so that pad 32a on die 34a is exposed. The die stack is situated on the surface 39 of the support such that the edge 31a of the first (lowest) die 34a is aligned with the bond pad 36, and the bond pad is at least partly exposed. The electrically conductive interconnect 318 contacts the bond pad 36, the die pad 32a, and the die pad 32b (and successive die pads in the overlying die), and it is disposed upon the coating 37, which electrically insulates the interconnect from the underlying die surfaces.

Contacts of the electrically conductive interconnect with die pads and a bond pad formed as described above with reference to FIGS. 3A, 3B, 3C, may result in a satisfactory electrical die-to-die electrical interconnection, or die-to-support electrical connection. Where the pad pitch is very fine and the die pads and bonds pads are small, however, such constructs may be vulnerable to fatigue failure, in which electrical connections become unsatisfactory following repeated thermal cycling. Modeling the system (in some instances together with observation of failed interconnects) shows that the interconnects are under tension during or following thermal cycling, causing the conductive material to pull away (delaminate) from the pad, for example as suggested by the arrows A in FIG. 3C, and to degrade or destroy the electrical continuity between the conductor and the pad.

Further, particularly where the interconnects are very thin, modeling the system (in some instances together with observation of failed interconnects) reveals cracks or breaks in the interconnects at the "inside corner" where the backside edge (e.g., edge 331a in FIG. 3C) of the lowermost die in the stack meets the underlying substrate.

As noted above, where the front side of the die is covered by an electrically insulative coating, pads on the die are made available for electrical connection by selectively removing the electrically insulative coating over the pads. When the interconnect material is deposited over the die in the stack, the material contacts only the exposed pads, and no electrical contact is made with pads (or with other die surfaces overlain by the interconnect material) that remain covered by the electrically insulative coating. In FIGS. 3A, 3B, 3C all the pads on all the die are shown as being exposed for electrical connection by the conductive traces and, accordingly, each of the pads in each die is in these examples electrically connected to pads on the other die in the stack and to a bond pad on the substrate. Depending upon the pad layout design on the die, it may not be desired to make electrical connection of all the pads on a given die with pads on other die or with circuitry in an underlying support. In such circumstances, the electrically insulative coating over selected ones of the pads on each die may be removed to expose the selected pads, and the coating may be left in place on pads to which electrical connection is not desired. This may be referred to as a "subtractive procedure" for making pads selectively available for electrical contact. Or, alternatively, in an "additive procedure", an electrically insulative coating may be applied selectively to areas over which the electrical traces may be formed, at which no electrical contact is intended.

Some types of interconnect failure can result from transverse cracks in the trace itself, which typically propagate from a surface of the trace material, and which may occur during or following molding or encapsulation, such as during thermal testing or during thermal cycling in use. Accordingly, in another approach, particularly for example where the assembly is to be molded or encapsulated, the interconnect traces can be coated with a film of a material such as a polymer (for example, a parylene or a silicone rubber) prior to the encapsulating or molding procedure. A silicone rubber such as a room-temperature-vulcanizing silicone elastomer, can be suitable, these are available for example from Dow Corning. A film of such a material having a thickness about ½ mil (about 10 um), for example, may suffice to mitigate crack formation. Apparently (without limiting the invention) the film provides a sort of relief or lubrication at the interface of the interconnect material and the molding material or encapsulant, and thereby reduces stresses that may result in crack formation. Other materials can be selected to provide such stress relief or lubrication.

Figure 4A:
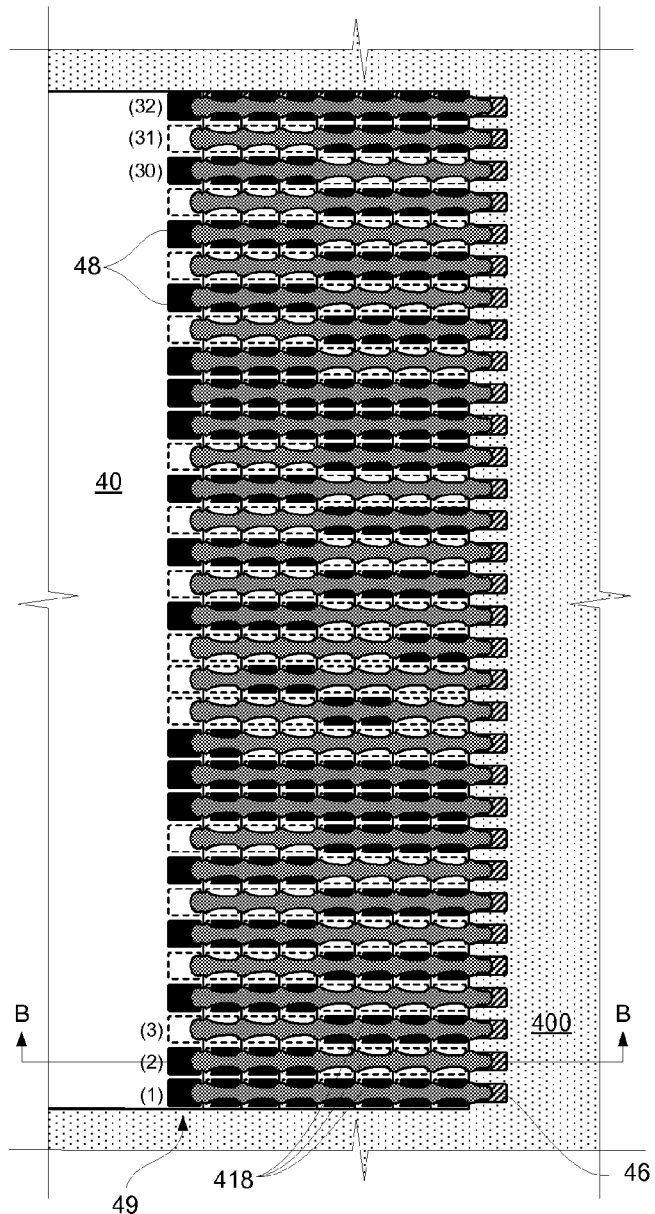
FIG. 4A is a diagrammatic sketch in a partial plan view showing the offset edges of an example of an 8-die offset stack, interconnected.
Figure 4B:
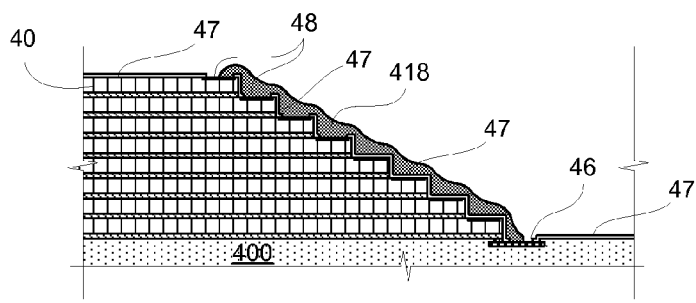
FIG. 4B is a diagrammatic sketch in a partial sectional view of an 8-die offset stack, as indicated at B-B in FIG. 4A, interconnected.

An assembly made using a subtractive procedure for making pads selectively available for connection is illustrated in FIGS. 4A, 4B. FIG. 4A shows by way of example a portion near the interconnect edge of an 8-die offset stack in a plan view. Each die has a row 49 of pads (e.g., pads 48; 32 pads in this example). The pads may be referenced by numbers 1 through n (1-32 in this example) according to the pad locations, as suggested by the numerals in parentheses (1), (2), (3)... (30), (31), (32) aligned with the pad positions on die 40. The die are stacked one over another and offset so that the interconnect edge of each die (except the lowermost die) is set back with respect to the interconnect edge of the die underlying it. The die are arranged in the stack so that corresponding pad locations are aligned in columns. The stack is mounted on a support (here a substrate) 400 having interconnect sites (bond pads or leads) 46. The lowermost die in the stack is oriented with the substrate so that the stack edge (that is, the lower die interconnect edge) overlaps the leads on the substrate, and so that the pad columns are aligned with the leads, so in this example there is no interconnect span dimension next to the stack.

The die stack in this example is covered with a conformal insulative coating 47 (of a material such as for example a parylene). Openings through the conformal coating were made (for example by laser ablation) to expose selected interconnect die pads (pads 48, for example), while leaving selected other interconnect die pads protected (electrically insulated).

FIGS. 4A, 4B show the interconnect portion of an 8-die offset stack, electrically interconnected with interconnect traces formed over the pad columns (e.g., traces 418 over columns (1), (2), (3)). FIG. 4B is a sectional view thru the construct of FIG. 4A at the pad location (2) column, as indicated at B-B in FIG. 4A. In this column, the pads in the upper four die (e.g., pad 48 in the fourth die from the top), and the bond pad 46 on the substrate, are exposed by openings in the conformal insulative coating; and the pads in the lower four die (as well as an area of the front side inboard from the pads on the top die, and the outboard area of the substrate) are left covered. The exposed pads are available for electrical connection by the interconnect trace formed over them, while the covered pads (and other covered surfaces) are insulated from contact with any overlying electrical traces. The traces 418 electrically connect exposed die pads in the column (e.g., pad 48) to other exposed die pads in the column and to a corresponding interconnect site 46 on the substrate 400. Pads that remain covered by the insulative coating and other die surfaces overlain by the interconnect material are not electrically connected.

The interconnect material is a material that can be applied in a flowable form, and thereafter cured or allowed to cure to form the conductive traces. To form the traces, the stack of die may be supported, for example, at the back side of the lowest of the die in the stack, and the interconnect material may be applied along a trajectory over the pads to be connected and the die surfaces between them. The interconnect material may be applied using an application tool such as, for example, a syringe or a nozzle. The material exits the tool in a deposition direction generally toward the interconnect terminals, and the tool is moved over the die stack face in a work direction. The material is deposited while the tool is moved. The material may be extruded from the tool in a continuous flow, or, the material may exit the tool dropwise. The material may exit the tool as a jet of droplets, and is deposited as dots which coalesce upon or following contact with a stack face surface. The droplets may be very small, and may exit the tool as an aerosol spray.

The interconnect material may be an electrically conductive polymer, such as a polymer filled with particles of an electrically conductive material. The material may be a curable polymer, for example, such as electrically conductive epoxy (for example, as silver filled epoxy); and, the interconnect process may include forming traces of the uncured material in a prescribed pattern and thereafter curing the polymer to secure the electrical contacts with the terminals and to secure the mechanical integrity of the traces between them. Or, the interconnect material may be an electrically conductive ink.

Figure 5:
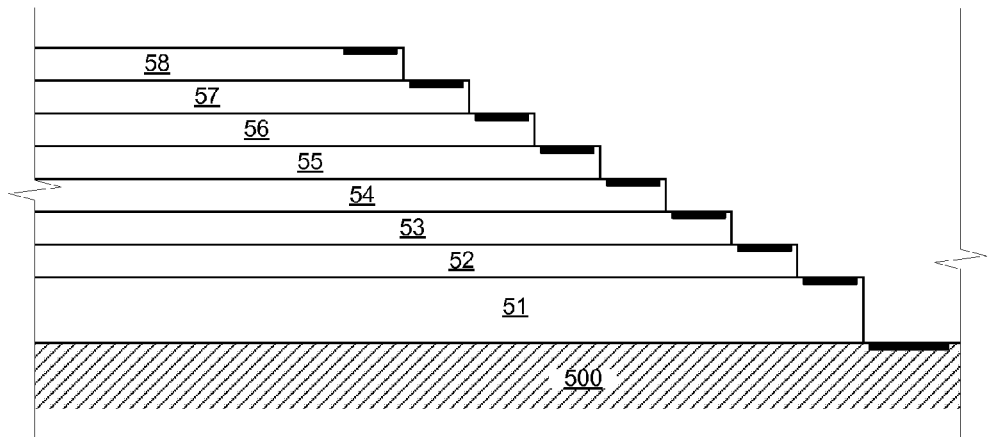
FIG. 5 is a diagrammatic sketch in a sectional view showing an example of a stacked die assembly constructed according to one of the approaches outlined above, having a thicker bottom die.

FIG. 5 illustrates an example of an assembly in which the bottom die 51 in the stack has a greater thickness than the other die 52, 53, 54, 55, 56, 57, 58 in the stack. Many details are omitted from the drawing for clarity of presentation. For example, die attach films may be employed, and a conformal dielectric coating (or other electrical insulation) may be provided over surfaces not intended to be electrically connected to overlying electrically conductive traces. Also, the interconnect traces are not shown in this drawing. The die 52, 53, 54, 55, 56, 57, 58 may have been singulated form a wafer that was thinned (for example in a backgrinding operation) to a desired thinness; and the die 51 may have been singulated from a wafer that was thinned to a greater thickness than the others. The bottom die may have the same (or similar) functionality as the other die in the stack; for example all the die in this stack may be memory die. Or, the bottom die may have a functionality different from that of the other die in the stack; for example the thicker bottom die may be a processor die, and the other die may be memory die. Other die functionalities are contemplated, according to the desired function of the completed assembly. The greater thickness of the bottom die provides increased stiffness to the stack, and can help to reduce warping or bending. What thickness may be required for the bottom die may depend upon, among other factors, the overall dimensions of the package, the thinness of the other die, and the extent of the CTE mismatch in the various components of the assembly.

Figure 6A:
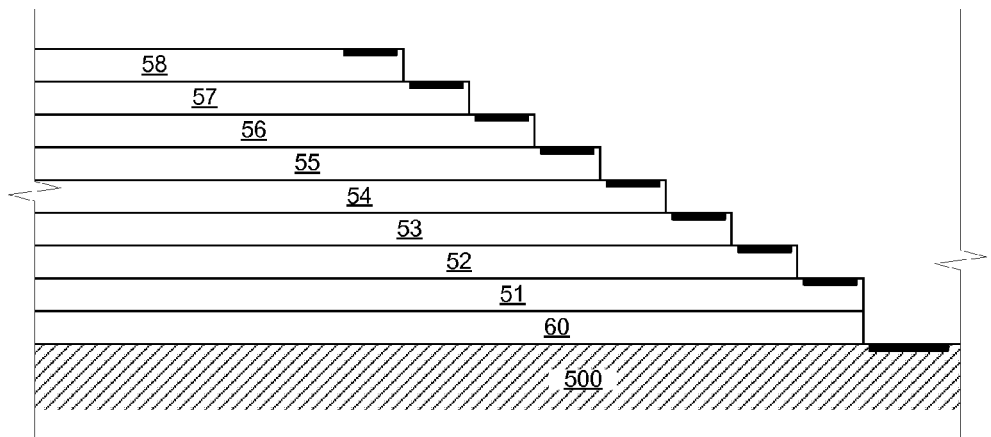
FIGS. 6A, 6B and 6C are diagrammatic sketches in sectional views showing examples of stacked die assemblies constructed according to another of the approaches outlined above, having a nonfunctional die situated at the substrate.
Figure 6B:
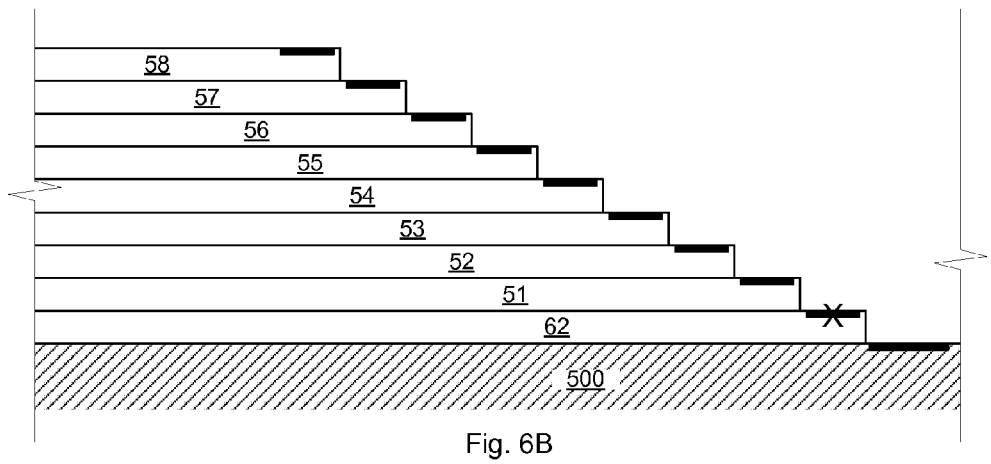
Figure 6C:
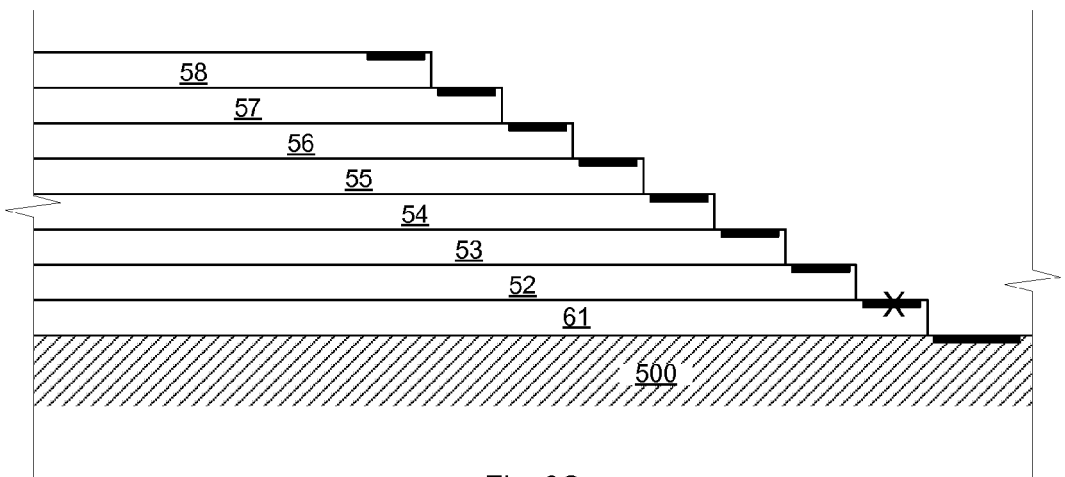

FIGS. 6A, 6B and 6C illustrate examples of stacked die assemblies in which a nonfunctional die is situated between the lowest functional die in the stack and the substrate. In FIG. 6A, for example, the nonfunctional die 60 is a "dummy" die;

that is, it has no electronic functionality. In this example an 8-die stack of die 51, 52, 53, 54, 55, 56, 57, 58 is mounted over the dummy die. An effect of the dummy die is to raise the horizon of the die pads (that is, the interconnect edge) on the lowest functional die 51 in relation to the bond pads on the substrate 500.

In FIG. 6B, for example, the nonfunctional die 62 has electronic circuitry and peripheral die pads and it may be configured substantially the same as the lowest functional die 51 in the stack. In this example the die pads on the nonfunctional die 62 are disabled, as symbolized in the drawing by the "X" over the pad. The pad may be, for example covered by a dielectric material, so that the additional die is not electrically connected to overlying interconnect traces. Or, for example the electrical connection of the pad to the circuitry on the die may be severed.

In the examples of FIGS. 6A and 6B, the nonfunctional die is an additional die; that is, the nonfunctional is interposed between the die stack and the substrate. The example in FIG. 6C is similar to that in FIG. 6B, except that here the nonfunctional die 61 is the lowermost die of the die stack itself, disabled in a manner for example as described above with reference to FIG. 6B. Because the lowermost die in the stack may have been fully functional before it was disabled, the die 61 may be referred to as a "sacrificial" die.

Figure 7A:
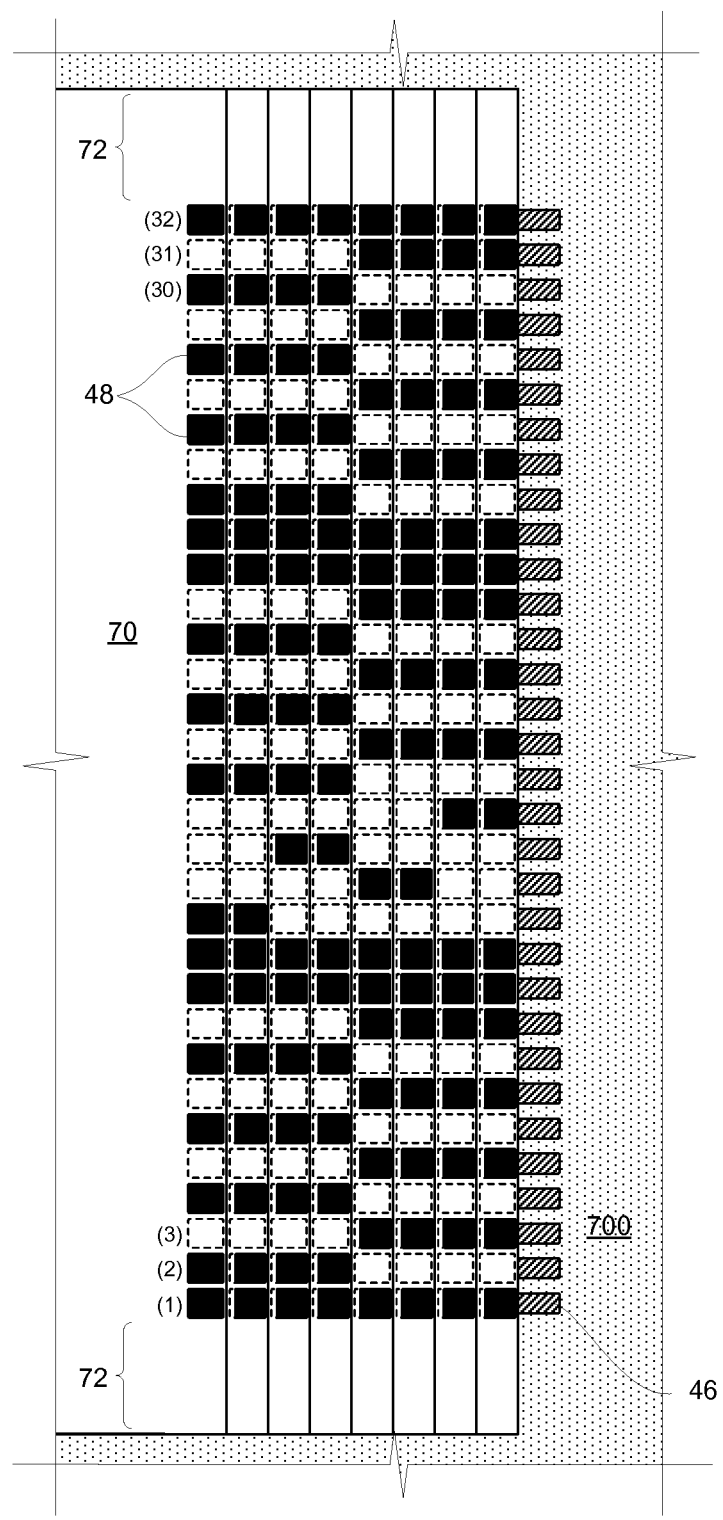
FIGS. 7A, 7B and 7C are diagrammatic sketches in sectional views showing examples of stacked die assemblies constructed according to another of the approaches outlined above, having zones near the corners of the die left free of electrical connection.
Figure 7B:
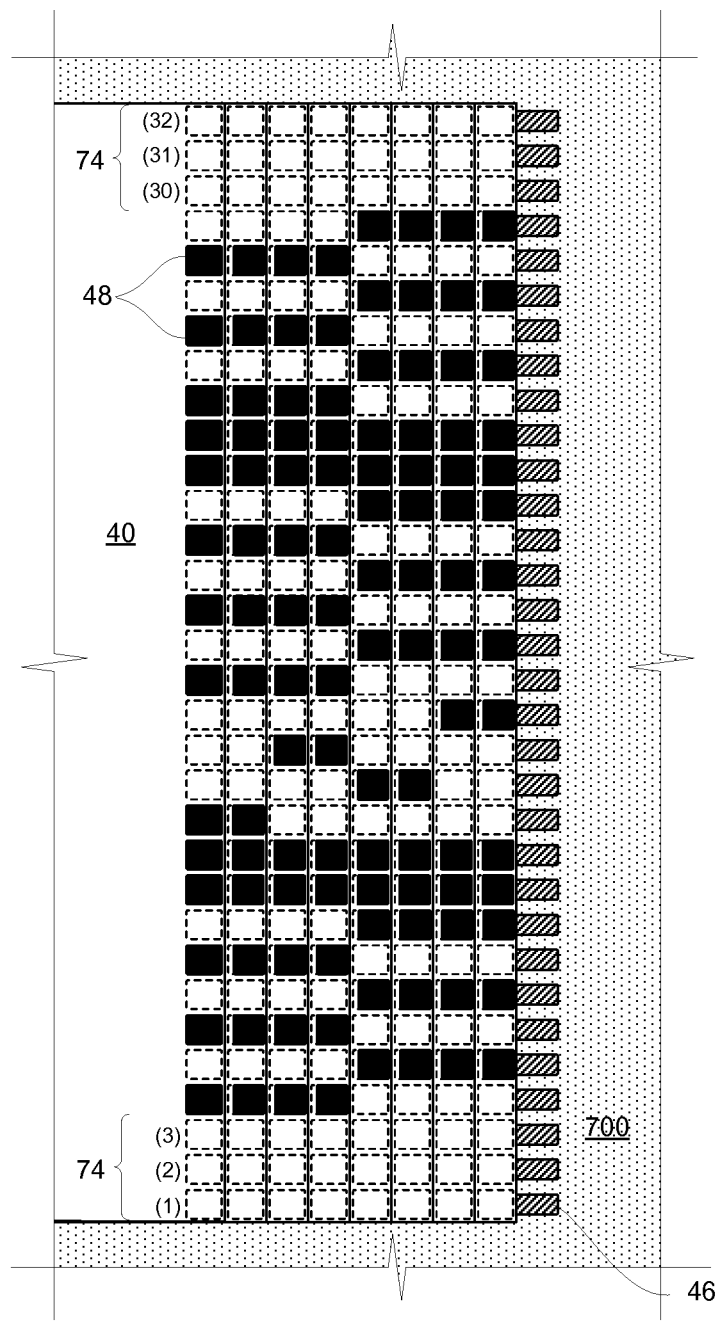
Figure 7C:
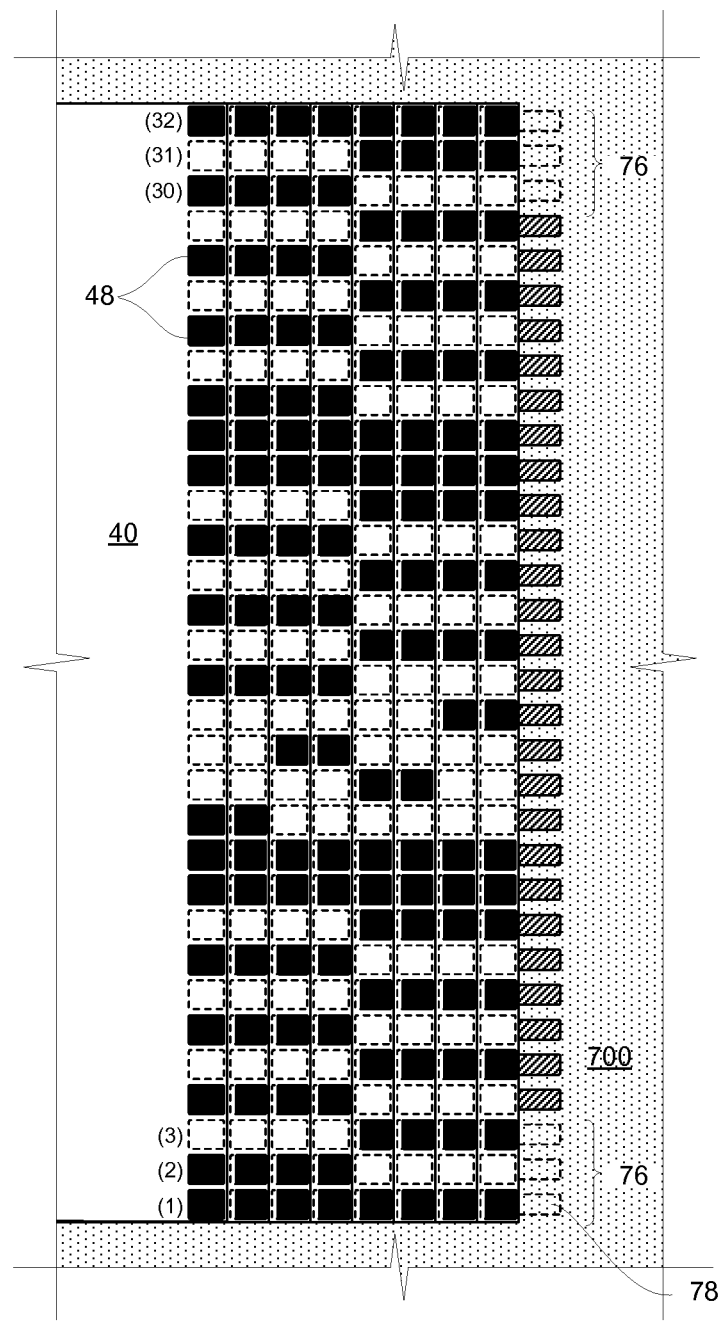

FIGS. 7A, 7B and 7C illustrate examples of stacked die assemblies in which zones near the corners of the die are left free of electrical connection. In some configurations, illustrated for example in FIG. 7A, the "keepout" zones 72 may constitute portions of the interconnect margin of the die at which no pads are situated. As noted above, this arrangement may designed into the placement of pads in a rerouting pattern; or, this arrangement may result during the die singulation process, by cutting the die wider than would be minimally required for the circuitry and the pad arrangement.

In some configurations, illustrated for example in FIG. 7B, the "keepout" zones 74 constitute disabling interconnection to pads at one or a few die pad positions ("sacrificial pad positions") near the affected corner; in the illustrated example the die pads in the sacrificial pad positions (1), (2), (3), and (30), (31), (32) are covered by a dielectric material (and no openings are formed over these columns of pads), so that the die is not electrically connected to overlying interconnect traces in the keepout zones.

In some configurations, illustrated for example in FIG. 7C, the "keepout" zones 76 are established not by disabling pads on the die, but in disabling bond pads at the corresponding positions on the substrate, or by designing the substrate so that no bond pads are located there. In the example illustrated, the bond pads in the keepout zones 76 remain covered by the substrate surface solder mask, or other substrate surface insulation.

Figure 8A:
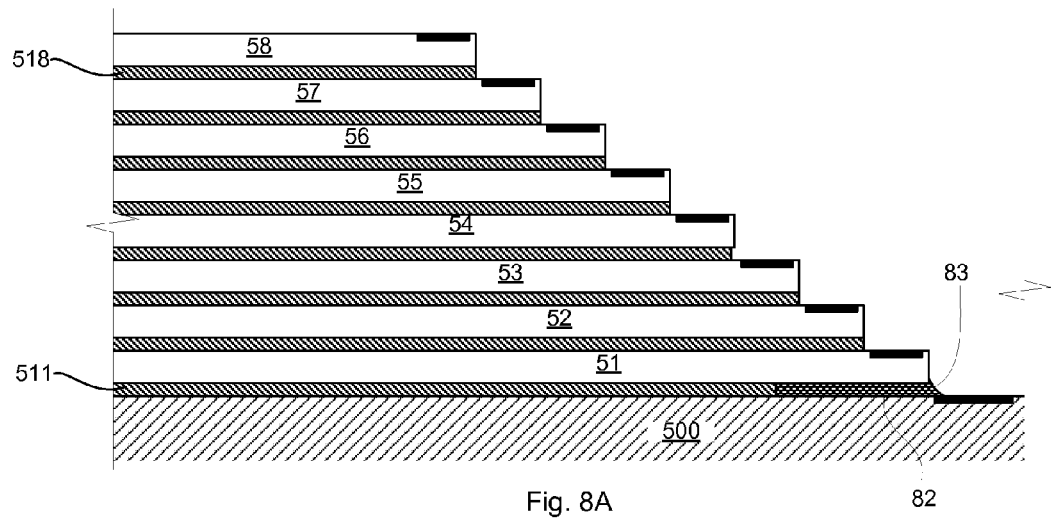
FIGS. 8A, 8B and 8C are diagrammatic sketches in sectional views showing examples of stacked die assemblies constructed according to another of the approaches outlined above, having underfill formed at various locations between the bottom die in the stack and the substrate.
Figure 8B:
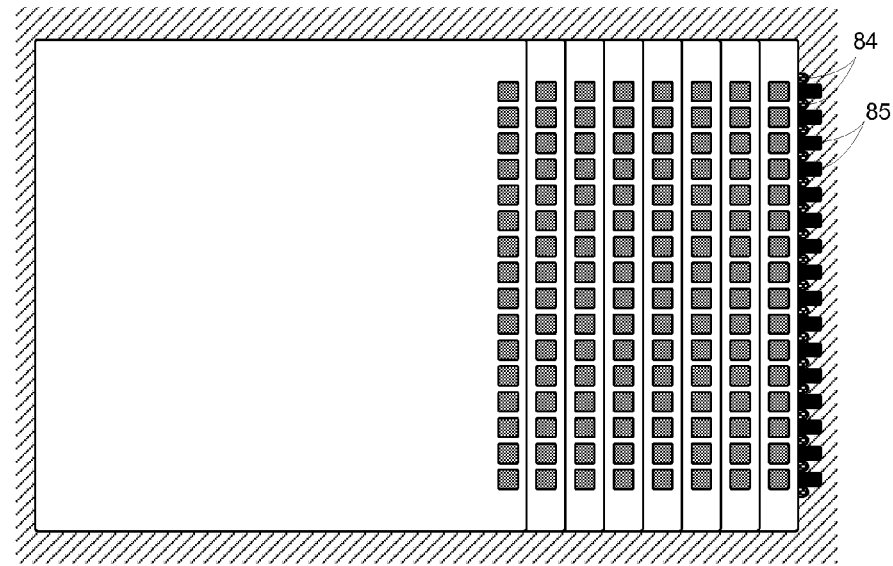
Figure 8C:
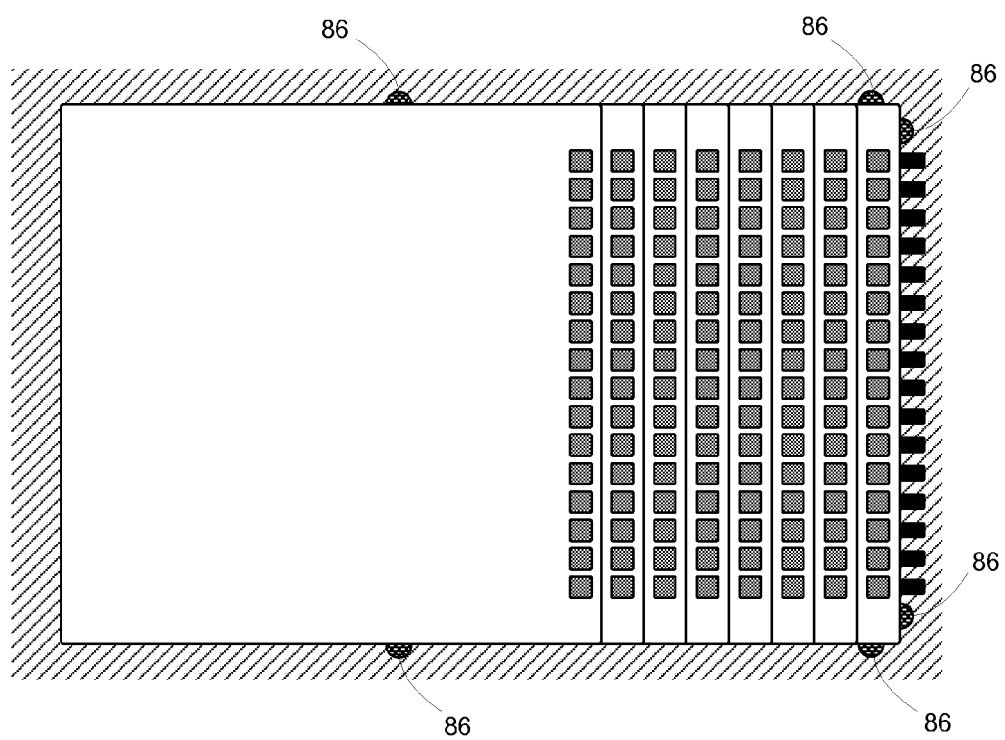

FIGS. 8A, 8B, 8C illustrate examples of stacked die assemblies in which an underfill is formed near one or more edges of the bottom die between the bottom die in the stack and the substrate. The underfill reinforces the adhesion of the die stack to the substrate, and helps prevent or reduce delamination along the edge.

An underfill is illustrated for example in FIG. 8A. Each of the die 51, 52, 53, 54, 55, 56, 57, 58 in the stack here is affixed to the underlying die (or to the substrate) by a die attach film; for example, film 518 affixes die 58 to the underlying die 57, and film 511 affixes die 51 to the substrate 500. Die attach film 511 is dimensioned so that some space between the die and the substrate is left unfilled by the film, adjacent the interconnect die edge. In the approach illustrated here, a quantity of underfill material is deposited at the die edge, and flows into this space, as shown at 82 in FIG. 8A, and may form a "fillet" 83 at the die sidewall.

The underfill may be applied in particular spots, at intervals along an edge, as illustrated for example in FIG. 8B, or continuously along an edge. In FIG. 8B, an electrically nonconductive underfill material is deposited at spots along the die interconnect sidewall, e.g. spots 83, generally between the bond pads, e.g., bond pads 85. As is characteristic of underfill materials, the underfill once deposited may flow into any space between the bottom die and the substrate.

In FIG. 8C, an underfill material is deposited at spots, e.g. spots 86, along the bottom die edge, near the corners of the bottom die. As is characteristic of underfill materials, the underfill once deposited may flow into any space between the bottom die and the substrate.

In other configurations an underfill is deposited in a continuous line along one or more of the non-interconnect sidewalls. Where an electrically conductive underfill is used, it can be deposited at any location where the underfill will not cause electrical shorting. The underfill approach can be employed for die stacks in which the die are offset, as illustrated here; or for die stacks where each die in the stack is smaller in at least one dimension that the die beneath (pyramid stack), or in stacks where successive die in the stack are staggered and may be rotated. Such configurations are described, for example, in U.S. application Ser. No. 12/124,077, referenced above.

Electrically conductive or electrically nonconductive underfill materials may be used. Where an electrically conductive underfill is used, it can be deposited at any location where the underfill will not cause electrical shorting. The underfill material may be applied using standard equipment, and may be applied either prior to or subsequent to formation of the electrical interconnect traces.

Figure 9A:
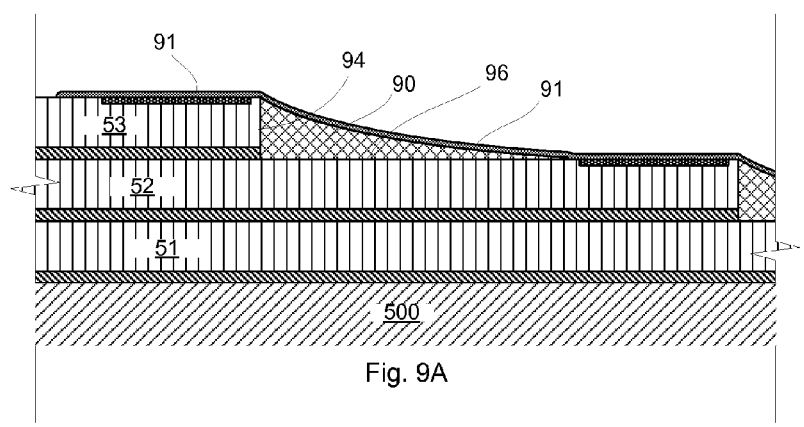
FIGS. 9A, 9B and 9C are diagrammatic sketches in sectional views showing examples of stacked die assemblies constructed according to another of the approaches outlined above, having an underfill fillet formed at the inside corner defined by a die sidewall and an underlying surface.
Figure 9B:
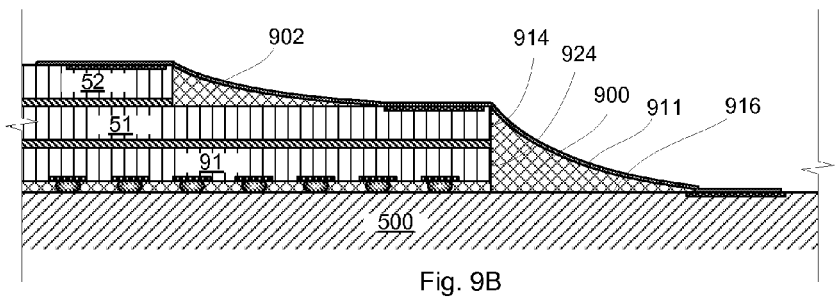
Figure 9C:
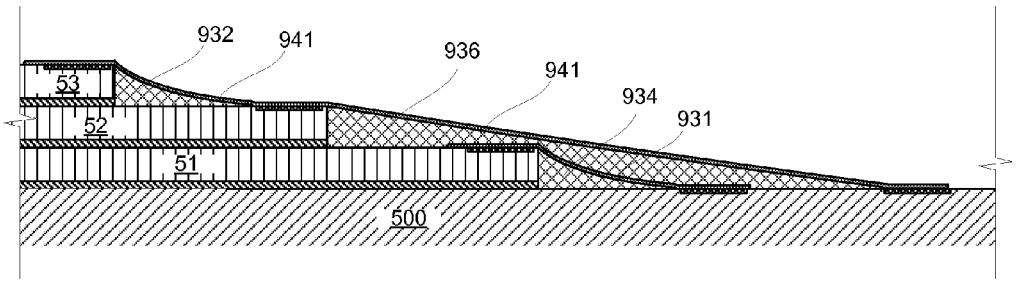

FIGS. 9A, 9B and 9C illustrate examples of stacked die assemblies in which an underfill material is deposited to form a fillet at the inside angle formed by a die sidewall and an underlying surface. FIG. 9A illustrates a configuration in which the die sidewall is the interconnect sidewall 94 of an upper die 93, and the underlying surface is an electrically insulated area 96 of the front side of an underlying die 52, inboard of the die pads on the underlying die and adjacent the upper die sidewall. The deposited underfill material forms a fillet 90 which provides a gradually sloping surface extending from the upper die interconnect edge to the underlying die surface inboard from the die pads, on which an electrical interconnect trace 91 can be formed, electrically connecting the pads on the upper die 53 and the underlying die 52 (and connecting additional die, e.g., die 51 as appropriate) to circuitry in the substrate 500.

A standard underfill material can be used, and it can be deposited using standard equipment for applying underfill. Preferred underfill material may be high modulus materials, having good CTE matching with other materials in the assembly. By way of example, one suitable standard underfill material is marketed under the name Namics U8439-1.

FIG. 9B shows a configuration in which die 51 and 52 are mounted die-up over a flip-chip die 91 mounted die-down on the substrate 500, and in which an underfill fillet 900 is formed at the inside angle formed by sidewalls 914, 924 of the die 51 and the flip chip die 91, and the surface 916 of the underlying substrate 500 inboard from the bond pads. In this example an additional fillet 902 is formed at the inside angles formed by the interconnect sidewall of the die 52 and the surface of the underlying die 51 inboard from the bond pads. The fillets 900, 902 provide a gradually sloping surface extending from the upper die 52 interconnect edge to the underlying die surface inboard from the die pads, and then from the die 51 interconnect edge to the underlying substrate surface inboard from the bond pads, on which an electrical interconnect trace 911 can be formed, electrically connecting the pads on the upper die 52 and the underlying die 51 to circuitry in the substrate 500.

FIG. 9C shows a further example, in which an underfill fillet 932 is formed at the inside angle formed between an interconnect sidewall of a die 53 and a surface of an underlying die 52; and an underfill fillet 934 is formed at the inside angle formed between an interconnect sidewall of a bottom die 51 and a surface of the underlying substrate 500; and an interconnect trace 931 is deposited on the fillet 934 to connect the bottom die 51 to a first row of bond pads on the substrate 550; and thereafter an underfill fillet 936 is formed over the fillet 934 and the trace 931,; and thereafter an interconnect trace 941 is formed over the fillet 932 and the fillet 936 to connect the upper die 53 to the die 52 and to a second, outboard, row of bond pads on the substrate 500.

The underfill may be formed so that it forms a fillet approximating a right triangular shape in transverse section; viewed in this way the hypotenuse of the triangle shape is a sloping surface over which an interconnect trace can be formed; and a vertical side of the triangle forms an angle with the hypotenuse at or near the upper die interconnect edge. The sloping surface of the fillet may be slightly concave or convex, or may be a more complex slightly curved surface. The underfill can be CTE matched, to help stabilize the assembly, reducing delamination effects. Moreover, the underfill, shaped as described above, can provide a gradual transition from die-to-die or from die-to-substrate, eliminating abrupt angular (approximately right-angle) transitions at the interconnect edges of the die and at the inside corners where the back edge of the die sidewall meets the underlying surface. In some configurations, a first underfill fillet formed at the sidewall of a bottom die and a substrate can support a first set of electrical interconnect traces connecting pads on the bottom die with bond pads in a first row on the substrate; and an additional underfill fillet formed over the first interconnect traces on the first fillet at the sidewall of an upper die and the bottom die can support a second set of interconnect traces from die pads on the upper die to bond pads in a second row, outboard from the first row, on the substrate.

Figure 10A:
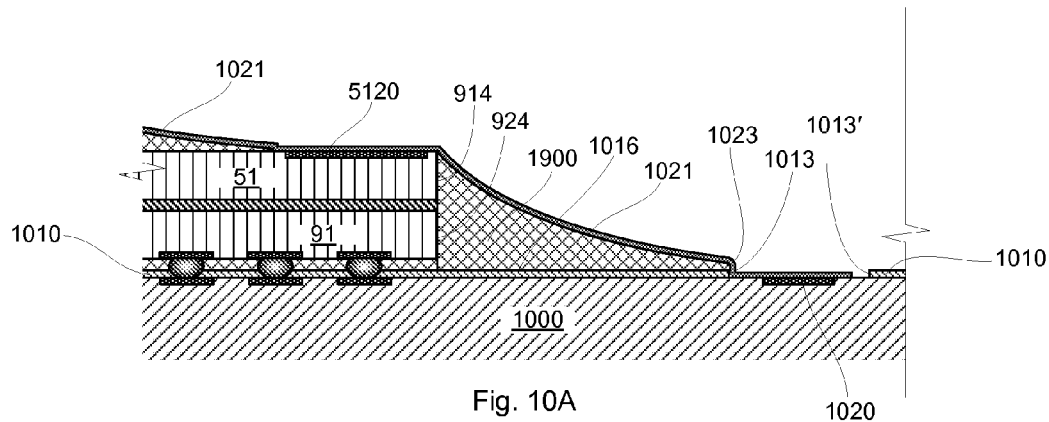
FIGS. 10A and 10B are diagrammatic sketches showing an example of a stacked die assembly constructed according to another of the approaches outlined above, having structures limiting the flow of underfill material over the substrate surface.
Figure 10B:
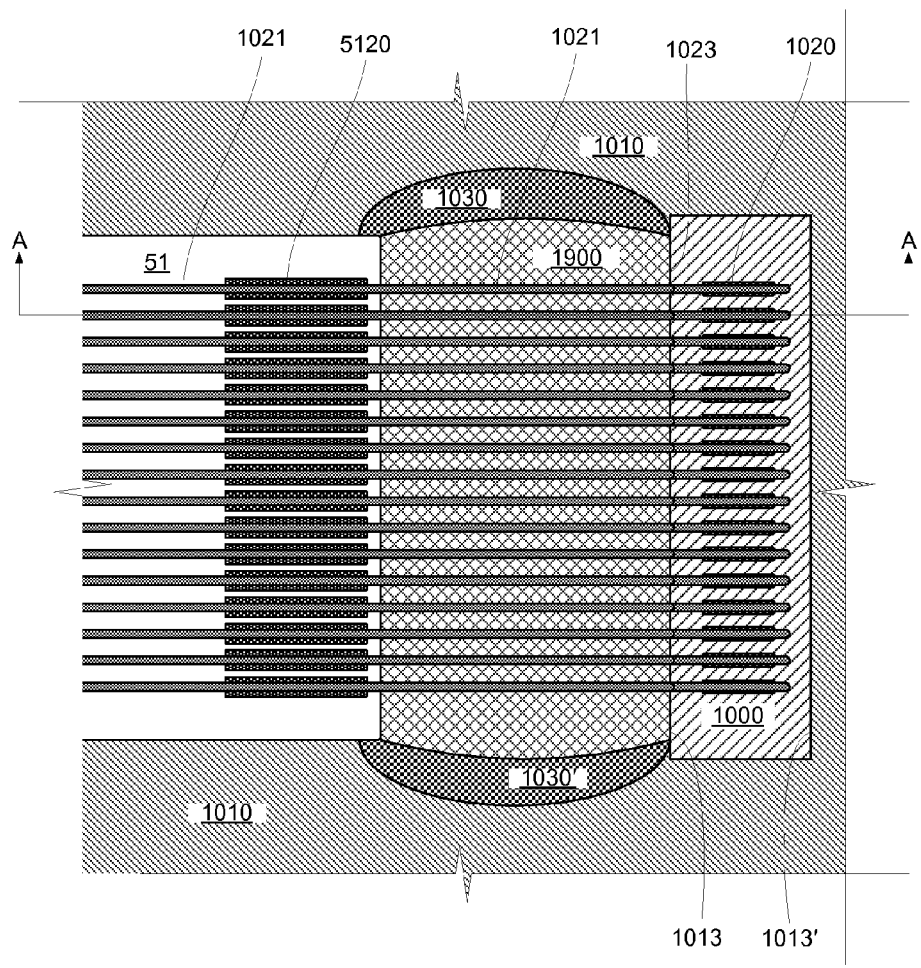

FIGS. 10A and 10B illustrate examples of approaches to assist in constraining the flow ("run-out" or "bleed") of the underfill material over the substrate. FIG. 10A is presented in a partial sectional view similar to that of FIG. 9B, in part; and FIG. 10B is presented in a partial plan view, in which the sectional view of FIG. 10A is indicated by the arrow A-A. These FIGs. show a configuration in which a die 51 is mounted die-up over a flip-chip die 91 mounted die-down on a die attach side of the substrate 1000, and in which an underfill fillet 1900 is formed at the inside angle formed by sidewalls 914, 924 of the die 51 and the flip chip die 91, and the surface 1916 of the underlying substrate 1000 inboard from the bond pads 1020. The fillets 1900 provides a gradually sloping surface extending from an upper die (out of the frame of the drawing) to the underlying surface of die 51 inboard from the die pads 5120, and then from the die 51 interconnect edge to the underlying substrate surface inboard from the bond pads 1020, on which an electrical interconnect trace 1021 can be formed, electrically connecting the pads on the upper die and the die 51 to circuitry in the substrate 1020.

The die attach side of the substrate 1000 is covered by a solder mask 1010, and a trench having trench walls 1013 through the solder mask 1010 exposes bond pads 1020 on the substrate 1000 for connection.

These FIGs. illustrate an example of an approach for limiting the bleed or run-out of the underfill material over the substrate surface, in which the die attach side of the substrate 1000 is covered by a solder mask 1010. In this example the trench in the solder mask has trench walls 1013, 1013', and at least trench wall 1013, nearer the die, is situated generally parallel to the row of bond pads on the substrate (and generally parallel to the interconnect sidewall of the die). During deposition of the underflow material, the advancing front of the flowing material halts substantially at the edge of the trench wall 1013, as indicated at 1023. That is, the trench wall 1013 prevent run-out or bleed of the underfill material over the bond pads 1020 that are exposed within the trench.

FIG. 10B additionally illustrates an example of an additional approach to limiting the bleed or run-out of the underfill material over the substrate surface. (This approach may be used whether or not the substrate has a solder mask, and may be used either without the trench approach or in addition to it.) In this example a dam 1030, 1030' is provided at the location of each side of the underfill fillet prior to depositing the underfill material, to limit or prevent flow of the underfill material laterally, that is, in directions generally parallel to the row of die pads.

The dam material may be a curable material applicable in a flowable form and thereafter cured or allowed to cure, and the dam material may have properties that make it generally less likely than the underfill material to flow (run-out or bleed) when in an uncured state. The dam material may have a higher viscosity, for example, than the underfill material. The dam material and the underfill material may be cured in the same cure procedure, or the dam material may be cured in an earlier cure procedure.

Any of various materials may be employed for the dam, having properties suitable for the particular underfill material. In a particular example, the underfill can be one marketed by Namics Corporation under the name "Chipcoat", such as the "Chipcoat U8439-1". And for such an underfill a suitable dam material can be one marketed by Lord Thermoset under the name "CircuitSAF™", such as the "CircuitSAF™ ME-456". This dam material, applied prior to depositing the underflow material, prevents or limits lateral flow of this underfill material; and both materials can be cured in one cure procedure, which may be for example heating the assembly at 165° C. for about 1 hour. Other suitable materials may be selected without undue experimentation.

Other embodiments are within the claims.

We claim:
1. An assembly comprising:
   a plurality of die in a stack mounted on a support and electrically interconnected to the support, wherein a face of a first die in the stack is adhesively bonded to a face of an adjacent die;
   a zone near a corner of a die in the stack having one or more sacrificial pad positions and one or more traces overlying the sacrificial pad positions and contacting the support; and
   a pad in one of the sacrificial pad positions is insulated by a dielectric material and is thereby left free of electrical connection with the overlying trace.

2. The assembly of claim 1 wherein the zone comprises a portion of an interconnect margin of the die at which no interconnect pads are situated.

3. The assembly of claim 1 wherein an electrical connection of the pad to the circuitry on the die is severed.

4. The assembly of claim 1 further comprising a second pad at one of the sacrificial pad positions wherein connection of the second pad to a corresponding bond pad is prevented by disabling the bond pad at the corresponding position on the support.

5. The assembly of claim 1 further comprising a second pad at one of the sacrificial pad positions wherein connection of the second pad to a corresponding bond pad is prevented by designing the support so that no bond pad is located there at the corresponding position on the support.

6. An assembly comprising:
a plurality of die in a stack mounted on a support, the stack including a first die and a second die and being electrically interconnected to the support;
a first underfill fillet extending outwardly from a first die sidewall of the first die and overlying a first surface;
a second underfill fillet extending outwardly from a second die sidewall of the second die and the second underfill fillet having a sloping surface that overlies a surface of the first die extending beyond the second die sidewall, and a portion of the second underfill fillet overlies a portion of the first underfill fillet;
a first set of interconnect traces formed on the sloping surface of the second underfill fillet, each interconnect trace formed by depositing a conductive material in flowable form along a trajectory over pads of at least one of the die or the support to be connected thereby.

7. The assembly of claim 6 wherein the first die sidewall comprises an interconnect sidewall of the first die, the first die being a die in the stack nearer the support.

8. The assembly of claim 7 wherein the first surface comprises an area of a die attach side of the support, inboard of bond pads on the support and adjacent the first die sidewall.

9. The assembly of claim 6 wherein the first die sidewall comprises an interconnect sidewall of a die farther from the support.

10. The assembly of claim 9 wherein the first surface comprises an electrically insulated area of the front side of a third die of the stack, inboard of the die pads on the third die and adjacent the interconnect sidewall of the first die farther from the support.

11. The assembly of claim 6 wherein the first die is a flip chip die oriented die-down on the support and electrically connected to the support in a footprint of the flip chip die and the first surface comprises an electrically insulated area of the die attach side of the support, inboard of bond pads on the support and adjacent the first die sidewall.

12. The assembly of claim 6 wherein the first die is stacked over a third die, the third die oriented die-down on the support and electrically connected to the support in a footprint of the third die ; and the first surface comprises an electrically insulated area of a back side of the underlying third die.

13. The assembly of claim 6 wherein the first underfill fillet is a fillet approximating a right triangular shape in transverse section, providing a sloping surface over which an interconnect trace can be formed.

14. The assembly of claim 13 wherein the sloping surface of the first underfill fillet is slightly concave or convex, or is a more complex slightly curved surface.

15. The assembly of claim 6 wherein the first underfill fillet supports a second set of electrical interconnect traces connecting pads on the first die with bond pads in a first row on the support.

16. The assembly of claim 15 wherein an additional underfill fillet formed over the first interconnect traces on the first fillet at the sidewall of an upper die and the lower die supports a second set of interconnect traces from die pads on the upper die to bond pads in a second row, outboard from the first row, on the support.

17. The assembly of claim 6, further comprising a dam to limit or prevent flow of an underfill material in a direction generally parallel to a row of bond pads on a substrate.

18. The assembly of claim 17 wherein the dam material comprises a curable material applicable in a flowable form and thereafter cured or allowed to cure.

19. The assembly of claim 6 wherein a die attach side of the support is covered by a solder mask, further comprising a trench in the solder mask, having a trench wall situated generally parallel to the row of bond pads on the substrate and between the bond pads and the first die sidewall.

20. The assembly of claim 6 wherein the first surface is a surface of the support.

21. The assembly of claim 6 wherein the first surface is a surface of a third die in the stack.

22. the assembly of claim 6 wherein the first underfill fillet has a sloping surface, the assembly further comprising a second set of interconnect traces formed on the sloping surface of the first underfill fillet.

23. the assembly of claim 6 wherein the first and second sets of interconnect traces electrically connect die pads of the second die and die pads of the first die with respective bond pads of the support.

24. the assembly of claim 6 wherein the first and second sets of interconnect traces electrically connect die pads of the second die and die pads of the first die with one another and with bond pads of the support.

* * * * *